(12) United States Patent
Kucherov et al.

(10) Patent No.: US 6,779,347 B2
(45) Date of Patent: Aug. 24, 2004

(54) SOLID-STATE THERMIONIC REFRIGERATION

(75) Inventors: Yan R. Kucherov, Salt Lake City, UT (US); Peter L. Hagelstein, Framingham, MA (US)

(73) Assignee: C.P. Baker Securities, Inc., Boston, MA (US)

(*) Notice: Subject to any disclaimer, the term of this patent is extended or adjusted under 35 U.S.C. 154(b) by 297 days.

(21) Appl. No.: 10/145,460

(22) Filed: May 13, 2002

(65) Prior Publication Data

US 2003/0033818 A1 Feb. 20, 2003

Related U.S. Application Data

(60) Provisional application No. 60/293,059, filed on May 21, 2001.

(51) Int. Cl.[7] .................... F25B 21/00; H01L 35/00; H01L 37/00
(52) U.S. Cl. .................................. 62/3.1; 136/200
(58) Field of Search .................... 62/3.1; 310/306, 310/304; 136/200; 257/10

(56) References Cited

U.S. PATENT DOCUMENTS

| | | | |
|---|---|---|---|
| 3,173,032 A | 3/1965 | Maynard | 310/4 |
| 3,267,308 A | 8/1966 | Hernqvist | 310/306 |
| 3,328,611 A | 6/1967 | Davis | 310/4 |
| 3,515,908 A | 6/1970 | Caldwell | 310/4 |
| 3,579,031 A | 5/1971 | Kearns | 315/363 |
| 3,808,477 A * | 4/1974 | Swank | 257/10 |
| 3,843,896 A | 10/1974 | Rason et al. | 310/4 |
| 3,890,161 A | 6/1975 | Brown, III | 136/212 |
| 3,899,696 A | 8/1975 | Fletcher et al. | 310/4 |
| 3,983,423 A | 9/1976 | Rasor et al. | 310/4 |
| 4,040,903 A | 8/1977 | Monroe, Jr. | 176/39 |
| 4,047,093 A | 9/1977 | Levoy | 322/2 |
| 4,151,438 A | 4/1979 | Fitzpatrick et al. | 310/306 |
| 4,188,571 A | 2/1980 | Brunson | 322/2 |
| 4,266,179 A | 5/1981 | Hamm, Jr. | 322/2 |
| 4,280,074 A | 7/1981 | Bell | 310/306 |
| 4,281,280 A | 7/1981 | Richards | 322/2 |
| 4,298,768 A | 11/1981 | Israel et al. | 136/202 |
| 4,303,845 A | 12/1981 | Davis | 310/306 |
| 4,323,808 A | 4/1982 | Davis | 310/306 |
| 4,346,330 A | 8/1982 | Lee et al. | 315/150 |
| 4,368,416 A | 1/1983 | James | 322/2 |
| 4,373,142 A | 2/1983 | Morris | 310/306 |
| 4,528,417 A | 7/1985 | Chubb | 136/253 |

(List continued on next page.)

FOREIGN PATENT DOCUMENTS

EP    0 452 661 A3    10/1991

OTHER PUBLICATIONS

Bass, John C., et al., Improved Thermoelectric Converter Units and Power Generators, *Electronics Tech Briefs*, Dec. 1999.

(List continued on next page.)

*Primary Examiner*—William C. Doerrler
(74) *Attorney, Agent, or Firm*—Workman Nydegger

(57) ABSTRACT

Solid state thermioninc refrigerators with elements having at least one barrier segment connected to wire-equivalent segments. The barrier segment has solid state regions that establish a potential energy barrier to electric carriers. This barrier is such that the circulation of a negative electrical charge from one of such regions to another region experiences an increasing potential energy. Elements can be superconducting or nonsuperconducting. Elements can also include an inverse barrier.

56 Claims, 16 Drawing Sheets

U.S. PATENT DOCUMENTS

| | | | |
|---|---|---|---|
| 4,667,126 A | 5/1987 | Fitzpatrick | 310/306 |
| 4,700,099 A | 10/1987 | Iden | 310/306 |
| 4,750,023 A * | 6/1988 | Shannon | 257/336 |
| 4,755,350 A | 7/1988 | Kennel | 376/321 |
| 4,771,201 A | 9/1988 | Free | 310/306 |
| 4,927,599 A | 5/1990 | Allen | 376/321 |
| 5,028,835 A | 7/1991 | Fitzpatrick | 313/14 |
| 5,327,038 A | 7/1994 | Culp | 310/306 |
| 5,459,367 A | 10/1995 | Davis | 310/306 |
| 5,492,570 A | 2/1996 | Horner-Richardson et al. | 136/200 |
| 5,541,464 A | 7/1996 | Johnson et al. | 310/306 |
| 5,572,042 A | 11/1996 | Thomas et al. | 257/10 |
| 5,578,886 A | 11/1996 | Holmlid et al. | 310/306 |
| 5,623,119 A | 4/1997 | Yater et al. | 136/225 |
| 5,637,946 A | 6/1997 | Bushman | 310/306 |
| 5,646,474 A | 7/1997 | Pryor | 313/310 |
| 5,722,242 A | 3/1998 | Edelson | 62/3.1 |
| 5,780,954 A | 7/1998 | Davis | 310/306 |
| 5,841,219 A | 11/1998 | Sadwick et al. | 313/293 |
| 5,955,772 A | 9/1999 | Shakouri et al. | 257/467 |
| 5,973,259 A | 10/1999 | Edelson | 136/254 |
| 5,981,071 A | 11/1999 | Cox | 428/408 |
| 5,994,638 A | 11/1999 | Edelson | 136/205 |
| 6,020,671 A | 2/2000 | Pento et al. | 310/306 |
| 6,022,637 A | 2/2000 | Wilson | 429/112 |
| 6,037,697 A | 3/2000 | Begg et al. | 310/306 |
| 6,203,939 B1 | 3/2001 | Wilson | 429/112 |
| 6,396,191 B1 * | 5/2002 | Hagelstein et al. | 310/306 |

OTHER PUBLICATIONS

Bates, Clayton W. Jr., "Low–Temperature Thermionic Emitters Using Metal–Semiconductor Composites", *Materials Letters*, vol. 23, (Apr. 1995), pp. 1–5.

Capper, P., "Properties of Narrow Gap Cadmium–based Compounds," EMIS Datareviews, Series No. 10, 1994.

Collier, C.P., et al., "Electronically Configurable Molecular–Based Logic Gates", *Science*, vol. 285 (Jul. 16, 1999) pp. 391–394.

DiSalve, Francis J., "Thermoelectric Cooling and Power Generation", *Science*, vol. 285 (Jul. 16, 1999) pp. 391–394.

Lin, T.P. et al., "Thermionic Emission Including Both Space– Charge and Image Forces," *Journal of Applied Physics*, vol. 85, No. 8 (Apr. 15, 1989), pp. 3205–3211.

Mahan, G.D., Multilayer Thermionic Refrigerator and Generator, *Journal of Applied Physics*, vol. 83, No. 9 (May 1, 1998) pp. 4683–4689.

Mahan, G.D. et al., "Multilayer Thermionic Refrigeration", *Physical Review Letters*, vol. 80, No. 18 (May 4, 1998) pp. 4016–4019.

Raser, Ned S., "VA Technology of Thermoeletric and Thermionic Energy Converstion". *Rasor Asociates Report*, (1989), pp. 397–414.

Rasor, Ned S., VB. Engineering Aspects of Thermionic Energy Converstion, *RASOR Associates Report*, (1989), pp. 415–439.

Rowe, D. M. Ph.D. D.Sc., "Selective Carrier Scattering in Thermoelectric Materials" *CRC Handbook of Thermoelectrics*, (1995) pp 67–73.

Shakori, Ali et al., "Heterostructure Integrated Thermionic Coolers", *Applied Physics Letters*, vol. 71, No. 9 (Sep. 1, 1997) pp. 1234–1236.

* cited by examiner

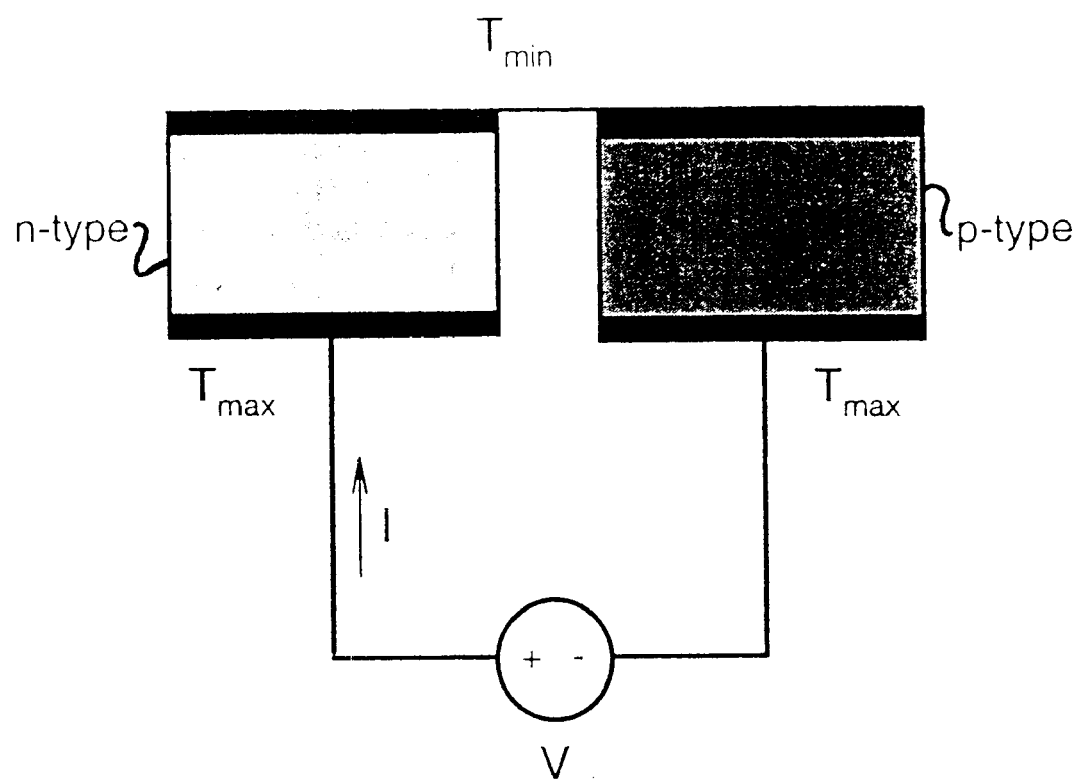
Figure 3.1

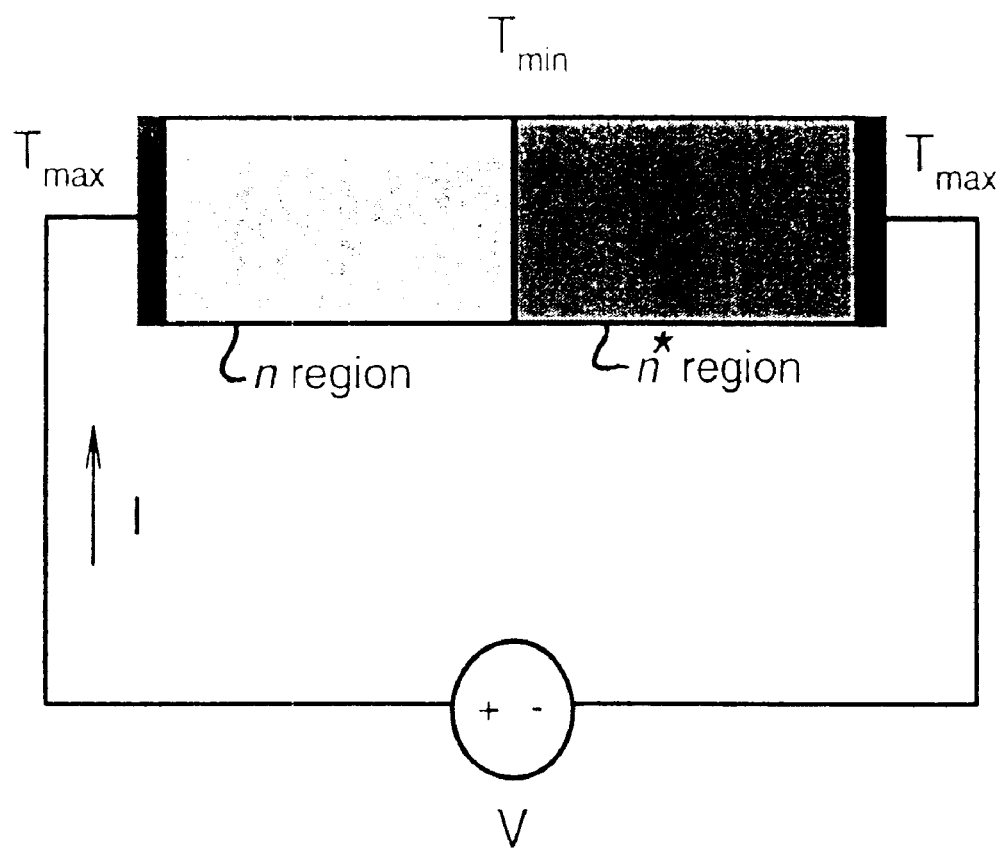
Figure 3.2

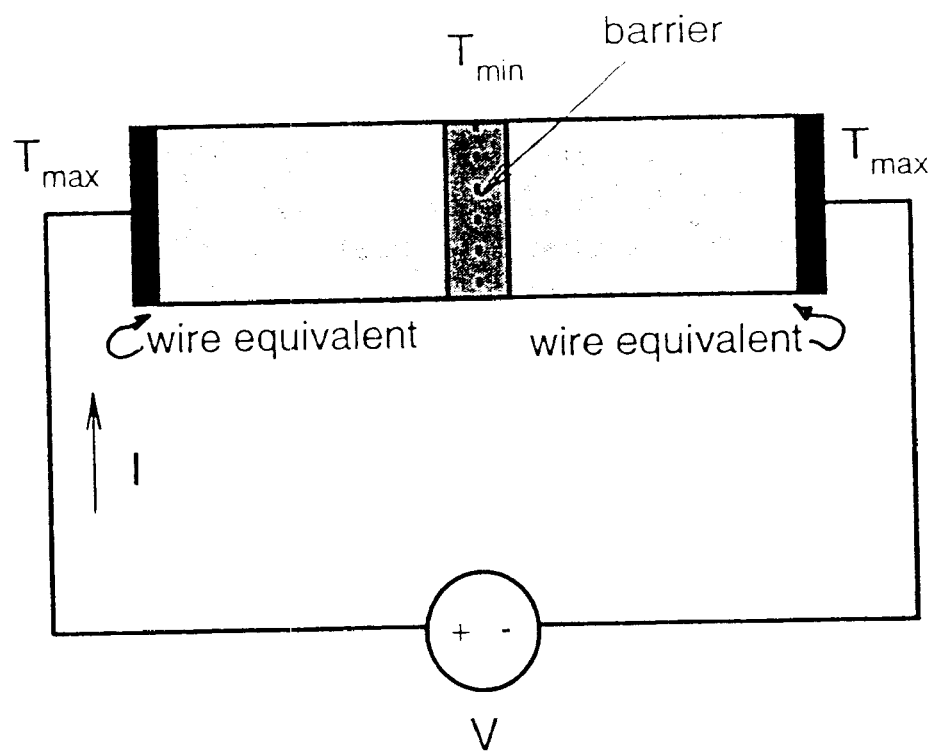
Figure 4.1

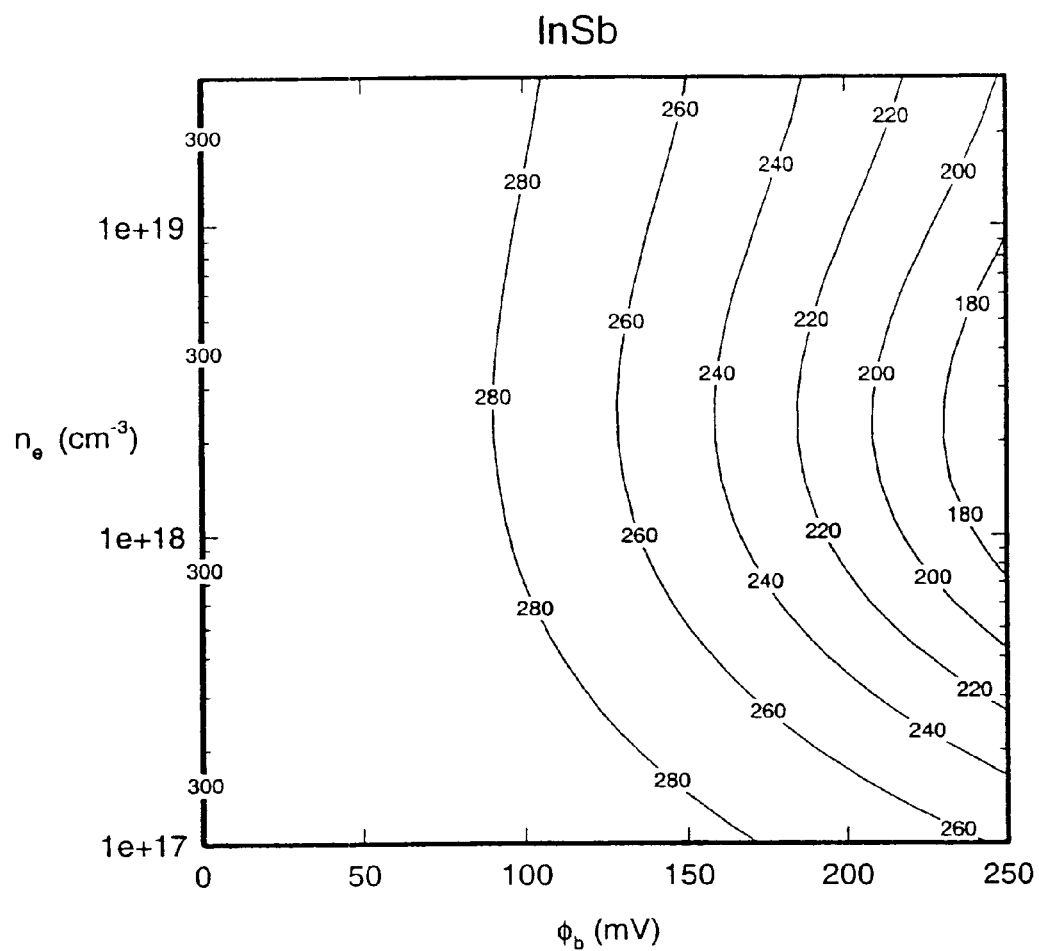
Figure 4.2

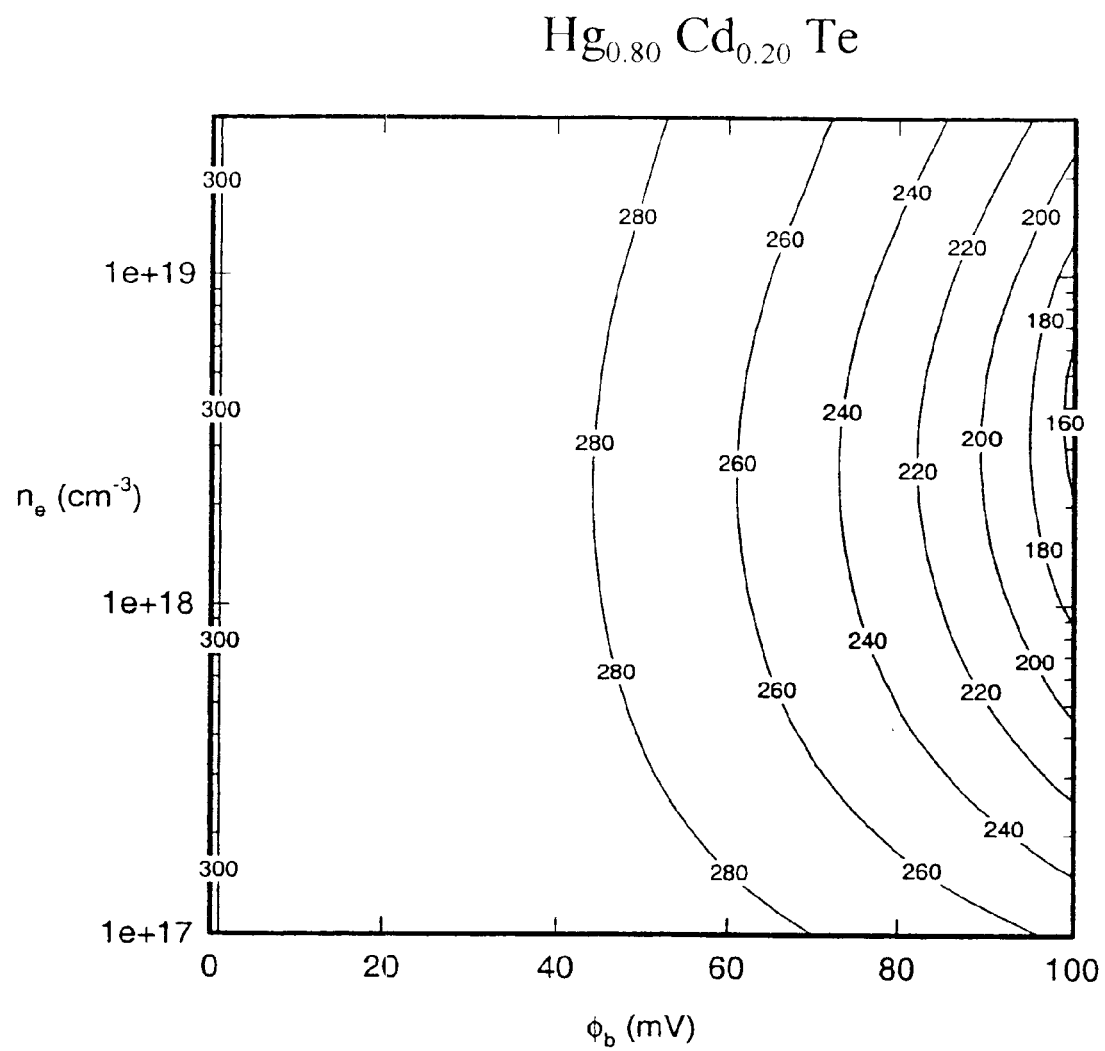
Figure 4.3

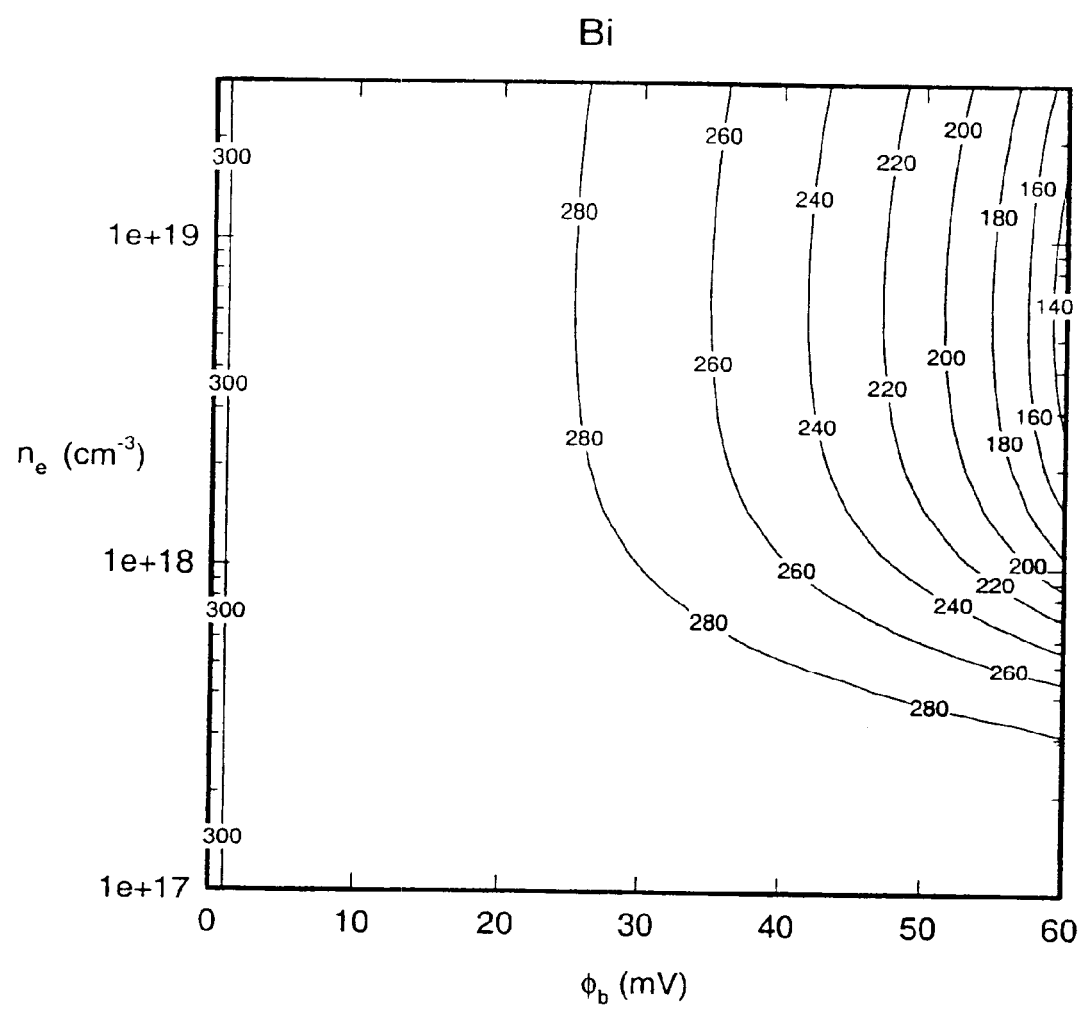
Figure 4.4

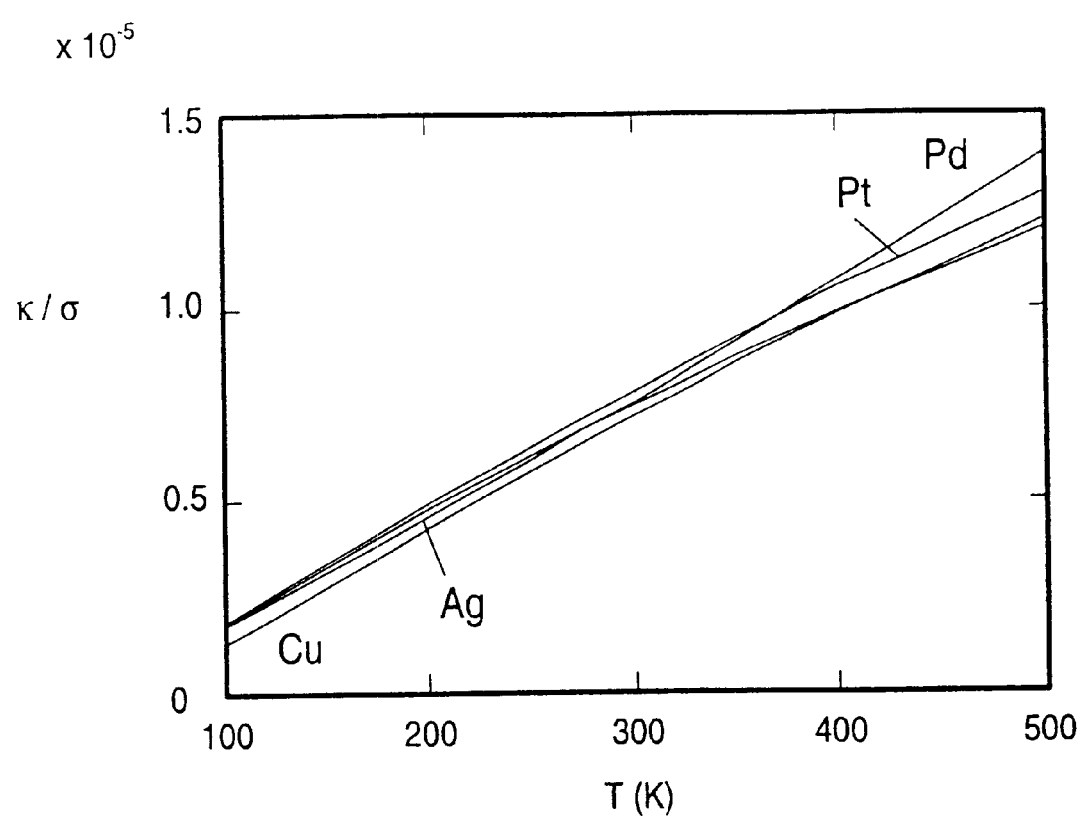
Figure 4.5

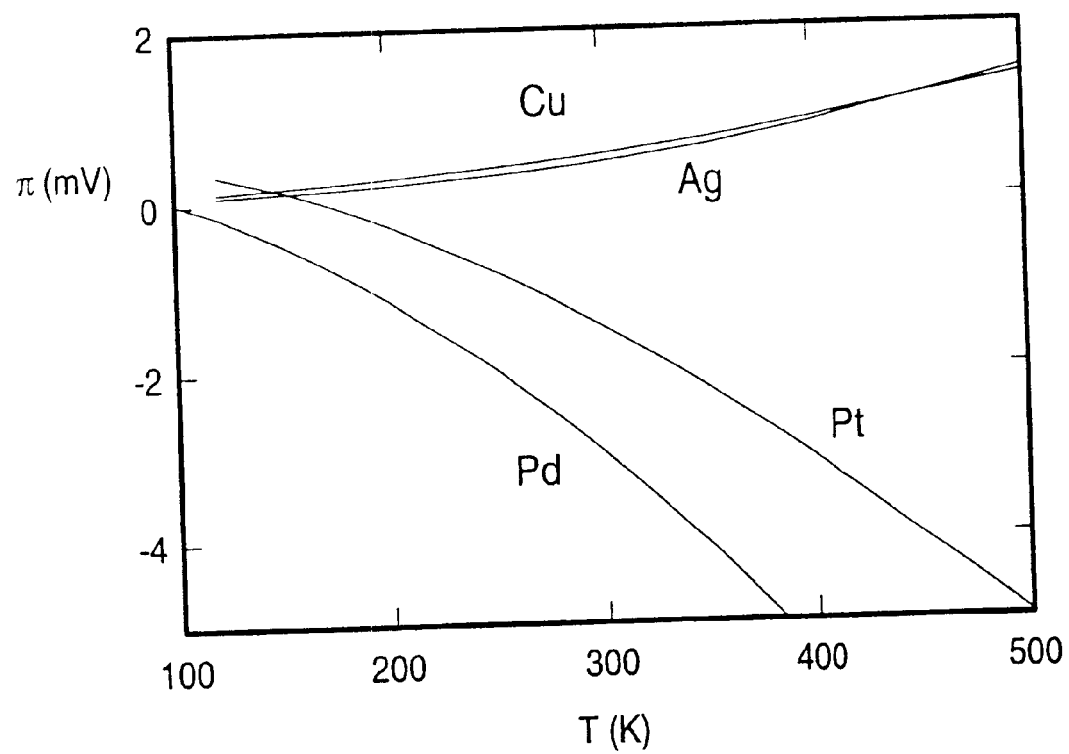
Figure 4.6

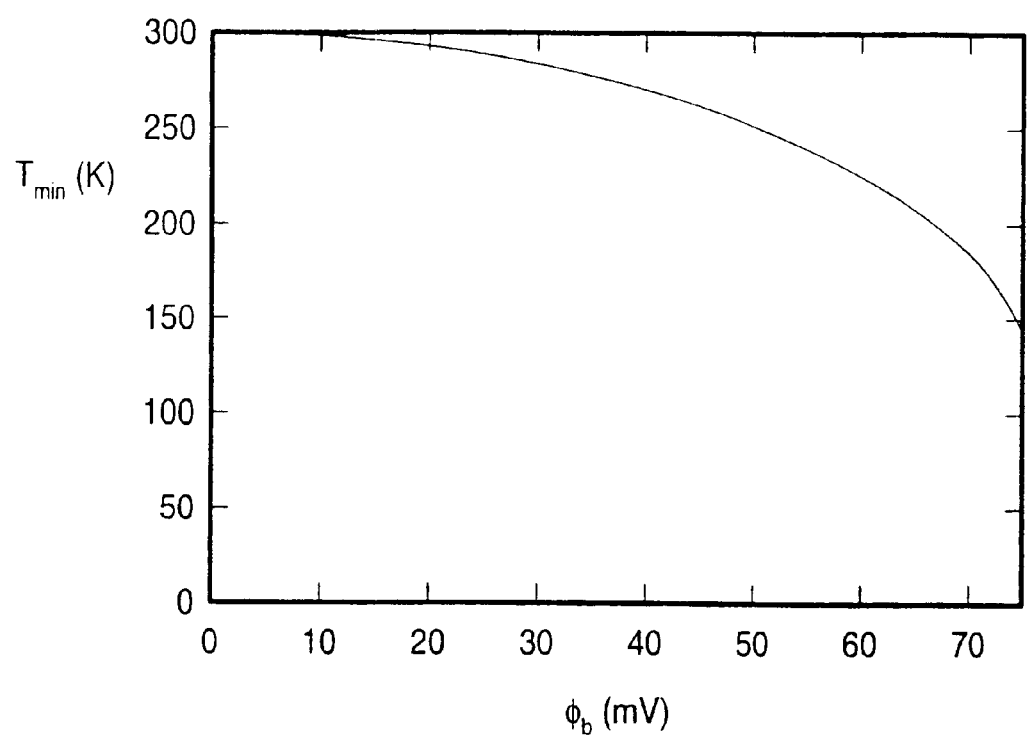
Figure 4.7

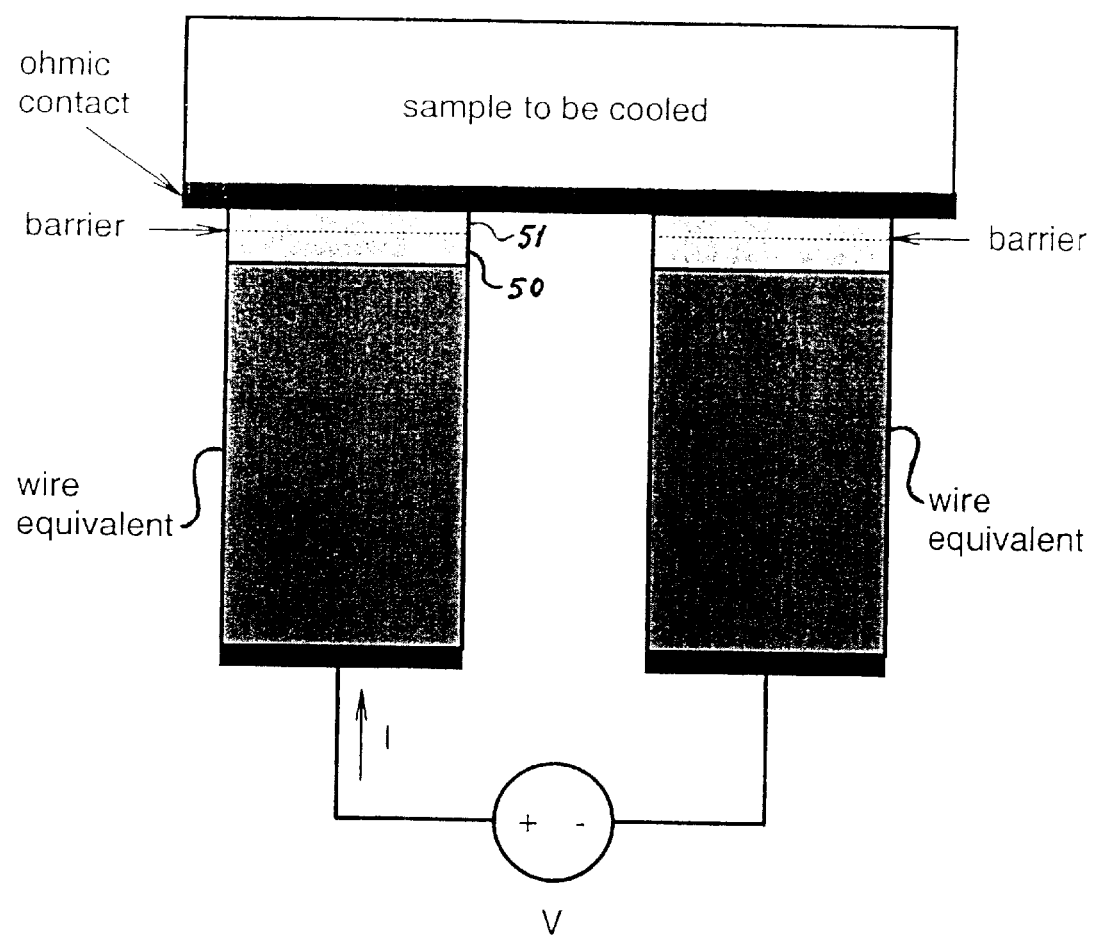
Figure 4.8

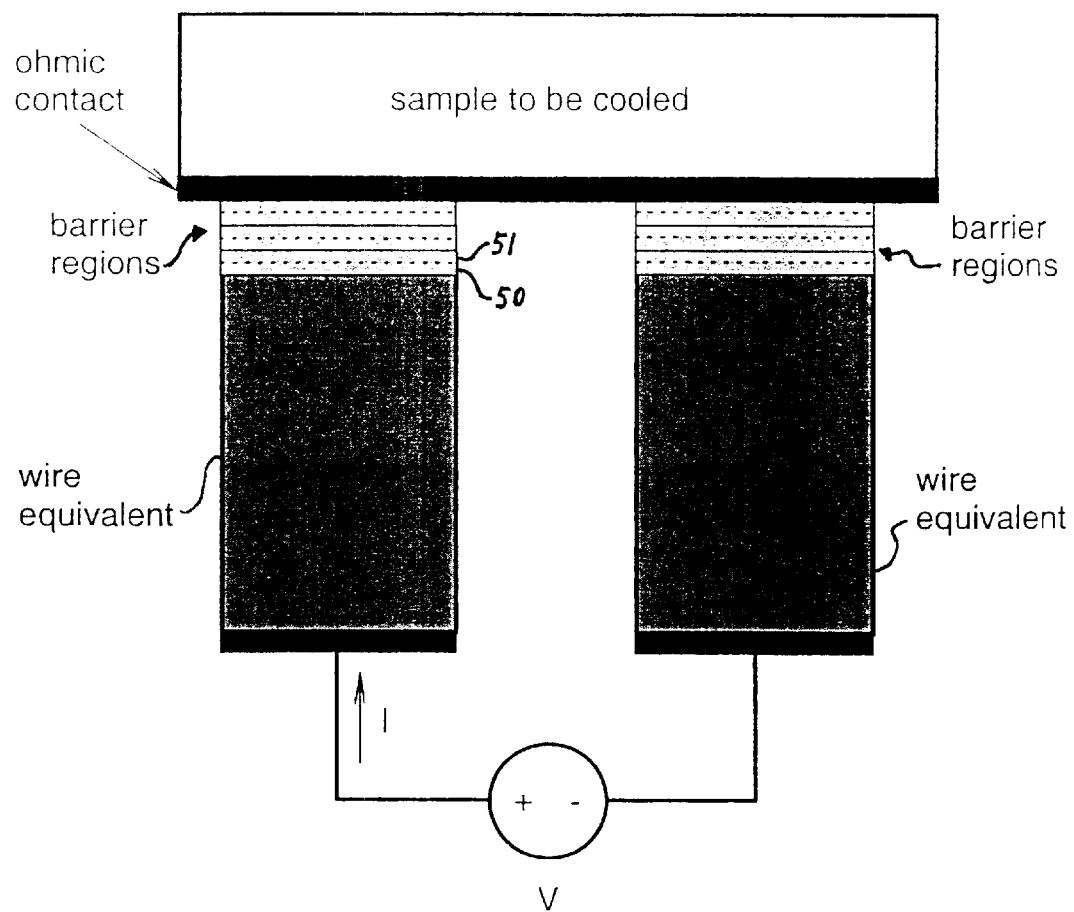
Figure 4.9

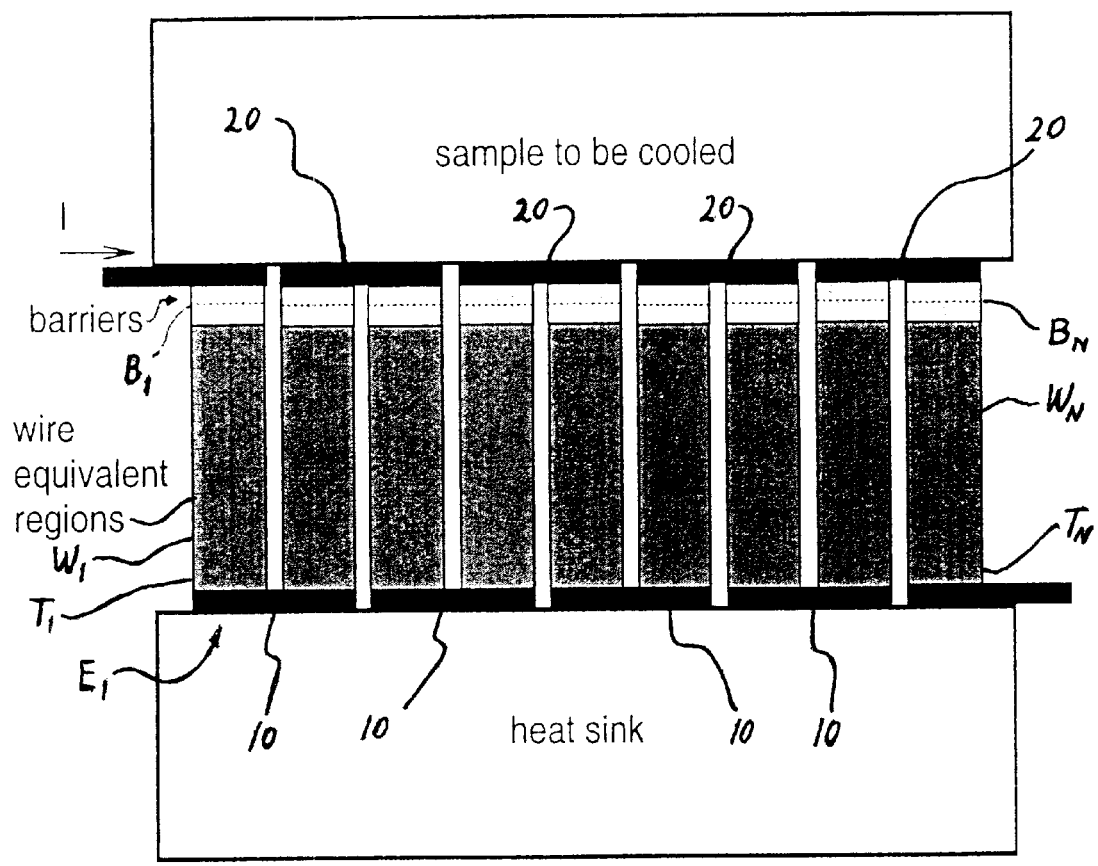
Figure 4.10

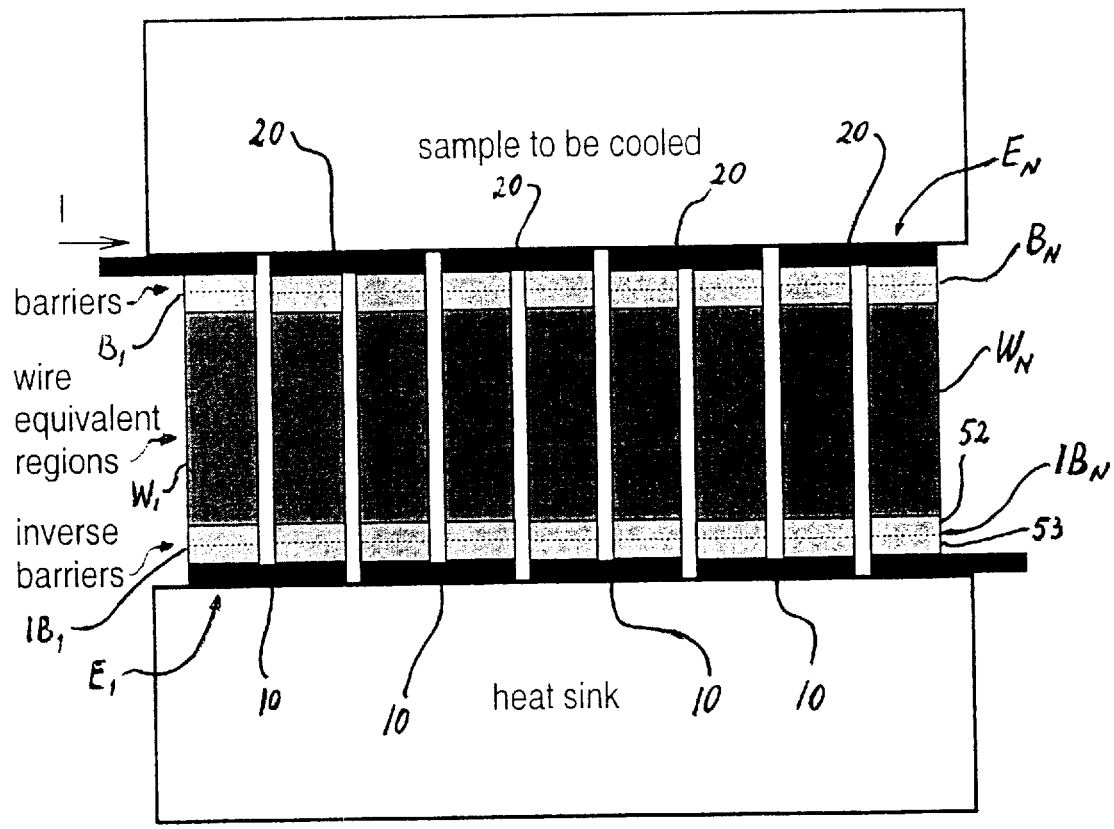
Figure 4.11

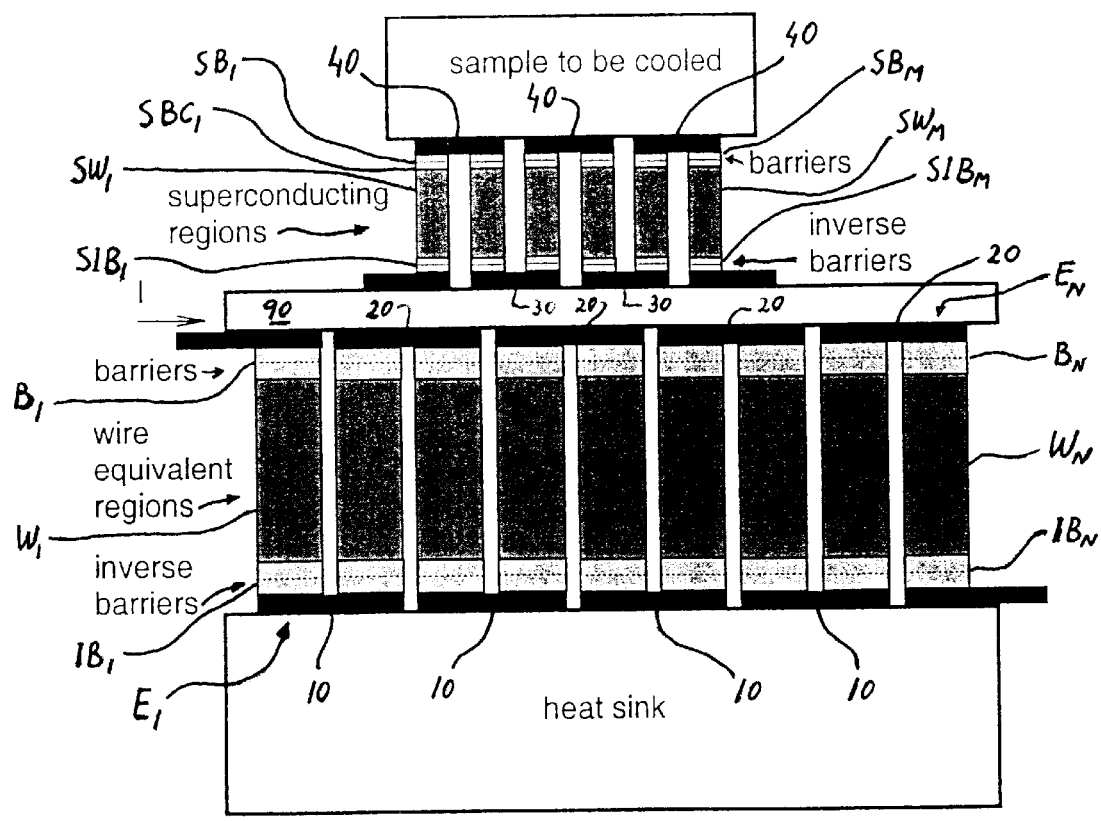
Figure 4.12

SOLID-STATE THERMIONIC REFRIGERATION

This application claims priority to U.S. Provisional Patent Application Serial No. 60/293,059, filed on May 21, 2001, which application is incorporated herein by specific reference.

BACKGROUND OF THE INVENTION

1. The Field of the Invention

Devices, systems and methods developed in the context of this invention relate to solid-state refrigeration technology.

2. The Relevant Technology

Solid-state thermoelectric and thermionic devices capture great attention in the areas of thermal energy to electric power conversion and refrigeration. Captivating and useful properties of such devices include their reduced size, potential for further miniaturization, and their performance under operating conditions such that they are free of circulating fluids and moving parts.

The efficiency of such devices in their conventional forms is presently too low for their wide use in general household and industrial applications. Furthermore, the design of such devices typically depends strongly on material technology because of their characteristics. For example, thermoelectric and thermionic materials should have high electric conductivity and yet behave as very good thermal insulators. If the electrical conductivity were too low, resistance heating would detrimentally warm a thermoelectric or thermionic cooler, and if the material were not a good thermal insulator, the heat transported by the electric current would flow from the hot to the cold side. These functionalities in conventional devices are interwoven and appear inseparable. Accordingly, thermionic and thermoelectric materials are designed by choosing constituents such that the material has acceptable electrical conductivity and heat insulating properties. A disadvantage with this conventional approach is that it has the inherent limitations of the technology of the materials that are to be designed and of their constituents.

It is therefore desirable to provide thermionic and/or thermoelectric devices whose design is not limited by materials science and technology. It is also desirable to provide thermionic and/or thermoelectric devices whose efficiencies are improved with respect to those of conventional thermionic and/or thermoelectric devices.

The present invention provides solutions to problems encountered in the art. Solutions provided by the present invention include thermionic devices whose design is not limited by materials science and technology. In particular, device design according to the present invention is performed in terms of separate thermal insulation and electric conduction functionalities. Devices according to the present invention include multi-element solid-state devices with improved efficiencies.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 3.1. Conventional thermoelectric cooling scheme. An n-type thermoelectric is connected through an ohmic metal contact to a p-type thermoelectric. Positive voltage induces a positive current flow, which transports electrons away from the top junction in the n-type side, and holes away from the top junction in the p-type side.

FIG. 3.2. Basic thermionic refrigeration scheme. The application of a positive voltage drives a positive current, which corresponds to electrons being driven from the $n^*$ region to the n region. Between the two regions is a junction (potential barrier) induced by a difference in the doping levels. Electrons transporting across the junction lose thermal energy, giving rise to a cooling effect.

FIG. 4.1. Schematic of a three-element thermionic refrigeration system. Thermodynamically efficient highly-doped semiconductor or semi-metal legs serve as wire equivalents to conduct current to the barrier while minimizing the heat flow. The barrier is implemented using a semiconductor or semimetal, taking advantage of differences in the potential energy of the carriers due to either doping difference (for $n^*n$ or $n^*p$ junctions) or chemical potential differences (for alloy junctions, such as appear in quantum well technology) on either side.

FIG. 4.2. Evaluation of the end-point temperature for a three-element refrigeration system for an InSb equivalent wire design as a function of electron density, and the design junction barrier.

FIG. 4.3. Evaluation of the end-point temperature for a three-element refrigeration system for an $Hg_{0.80}Cd_{0.20}Te$ equivalent wire design as a function of electron density, and the design junction barrier.

FIG. 4.4. Evaluation of the end-point temperature for a three-element refrigeration system for a bismuth equivalent wire design as a function of electron density, and the design junction barrier.

FIG. 4.5. Ratio of $\kappa$ in W/cm K, to $\sigma$ in 1/ohm cm for four representative metals.

FIG. 4.6. Peltier coefficients for four representative metals.

FIG. 4.7. End-point temperature as a function of barrier height for copper, as representative of a generic metal wire design.

FIG. 4.8. Schematic of implementation using a 2-sided cooling scheme. Thermal insulation is provided by wire equivalent regions. Cooling power is provided by semiconductor or semimetal regions that support potential (or chemical potential) barrier. The orientation of each barrier is such as to provide uphill barriers given the direction of carrier flow within the material.

FIG. 4.9. Schematic of implementation using a 2-sided cooling scheme. Thermal insulation is provided by wire equivalent regions. Cooling power is provided by semiconductor or semimetal regions that support potential (or chemical potential) barriers. The orientation of each barrier is such as to provide uphill barriers given the direction of carrier flow within the material.

FIG. 4.10. Many 2-sided cooling elements ganged together in series.

FIG. 4.11. Many 2-sided cooling elements with complementary barrier regions ganged together in series. In this case, individual elements act as heat pumps.

FIG. 4.12. Many 2-sided cooling elements with complementary barrier regions ganged together in series. In this case, individual elements act as heat pumps.

DETAILED DESCRIPTION OF THE PREFERRED EMBODIMENTS

1. Thermoelectric and Thermionic Solid-State Devices

Electric current flow effectuates heat transfer in solid-state devices such as thermoelectric and thermionic devices. The relationship between the flows of electric current and heat determine the efficiency of such devices. This efficiency can be represented in several forms. For example, efficiency can be given as a fraction or percentage of the maximum possible efficiency value that is imposed by the second law of thermodynamics. This maximum possible efficiency value is hereinafter referred to as the "Carnot cycle efficiency limit" or simply as the "Carnot limit". Other efficiency terms are the Peltier coefficient, the Seebeck coefficient, the figure of merit ("Z"), and the dimensionless quantity ZT, which is the product of the figure of merit and the temperature T.

Not all the efficiency terms rely on the same relevant variables. The Peltier coefficient is the ratio of heat flow to current for a particular material. Like the Peltier coefficient, the Seebeck coefficient represents an intrinsic material property. In one expression of the figure of merit, Z equals the Seebeck coefficient squared divided by the product of the electrical resistivity and the thermal conductivity, although a figure of merit for a given system can be defined in other ways. Finally, the dimensionless quantity ZT is the product of the figure of merit and the operation temperature. These terms, alone or in combination, are typically used to score different thermoelectric and thermionic devices.

Figure 1A:
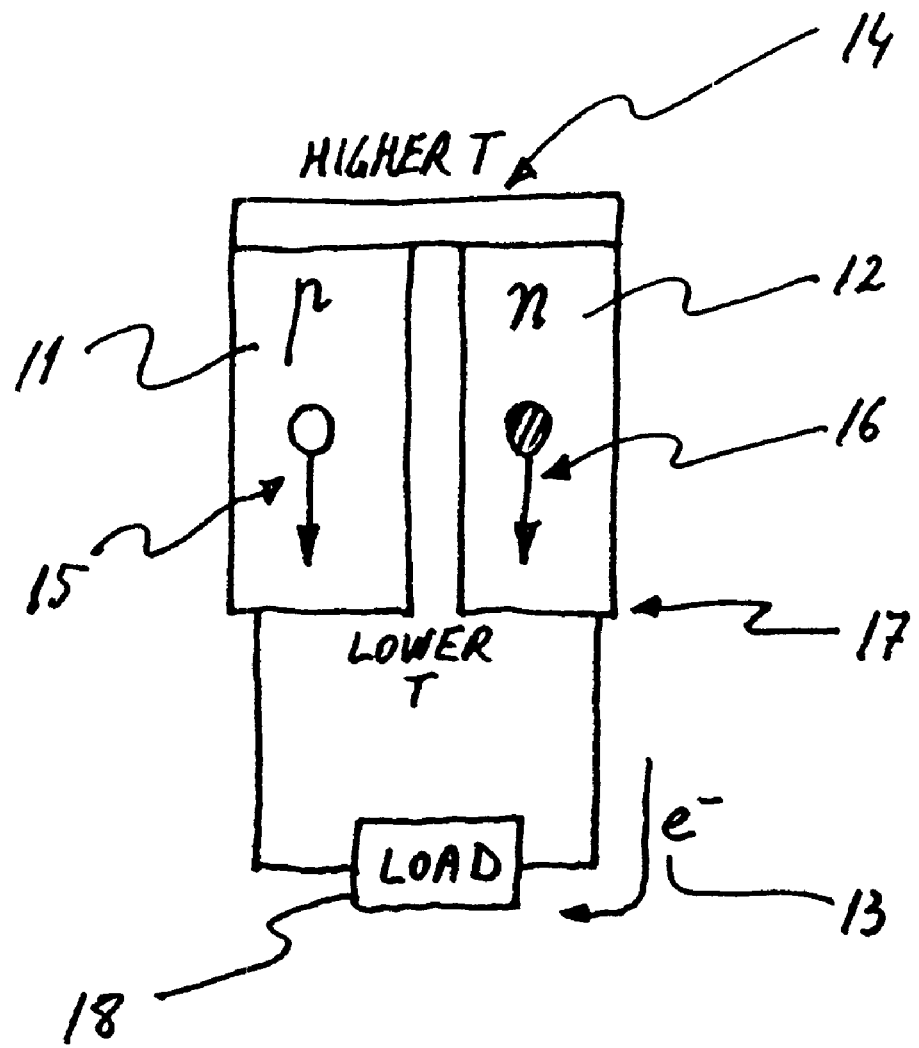
FIG. 1A illustrates a conventional thermoelectric device operating as a power generating unit.
Figure 1B:
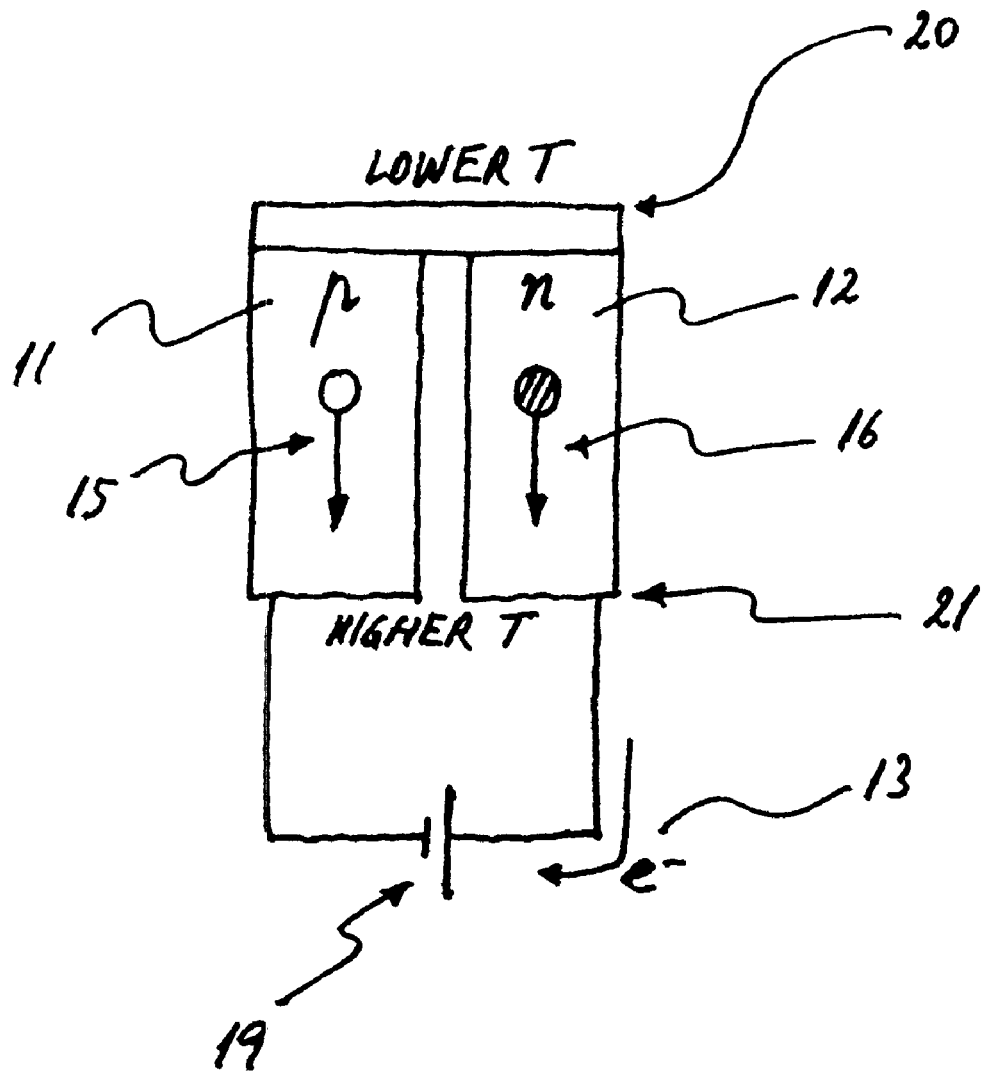
FIG. 1B illustrates a conventional thermoelectric device operating as a refrigerator.

The assertion that electric current flow effectuates heat transfer carries at least two implications. First, a thermal gradient imposed across a thermoelectric or thermionic will lead to a voltage manifested as an electric potential difference across such thermoelectric or thermionic. This is the power generation operating mode of a thermoelectric or thermionic. Second, an imposed electric potential difference across a thermoelectric will generate a thermal gradient across such thermoelectric. This is the refrigeration operating mode of a thermoelectric. FIGS. 1A–1B illustrate these operating modes.

The simple conventional thermoelectric device schematically shown in FIGS. 1A–1B comprises p-type material 11 and n-type material 12. An electron flow 13 is indicated to show the closed character of the circuits. As shown in FIG. 1A, heat flow is provided at end 14 from a hot source, and this thermal energy causes valence electrons in the p-type semiconductor 11 to move as indicated by arrow 15 and conduction-band electrons in the n-type semiconductor 12 to move as indicated by arrow 16. This charge carrier migration leads to the development of an electric potential difference at end 17 which drives an electric current 13 through a load 18 upon closing the circuit. End 14 is in thermal communication with a hot source and thus it is at a higher temperature T than the opposite end 17.

The refrigeration operating mode is schematically shown in FIG. 1B. Charge carrier flows 15 and 16 in this embodiment develop as a consequence of the voltage imposed by battery 19. These charge carrier flows transport heat from end 20 to end 21, thus causing a cooling at end 20 and a heat build-up at end 21 that is to be dissipated. The terms "cooler" and "refrigerator" are used herein as synonyms to refer thermoelectric and thermionic solid state devices operating in the refrigeration mode.

As indicated above, the refrigerator shown in FIG. 1B comprises two types of semiconductor 11 and 12 connected by an ohmic contact at 20. A structurally different embodiment is a thermal diode refrigerator. This and additional refrigerator embodiments are described hereinbelow.

The characteristics of thermoelectric devices are such that, when we focus only on the Peltier and Seebeck coefficients, the larger these coefficients are for a given device, the more useful such device is considered to be. Conventional thermoelectric coolers operate at efficiencies that are less than 5% of the Carnot cycle efficiency. The best conventional thermoelectric power generators have efficiencies that are less than 15% of the Carnot cycle efficiency. Provided here as a reference value, a typical household refrigerator operates at near 30% of the Carnot cycle efficiency. Conventional thermoelectric refrigerators have a ZT value of, at best, near unity, and this figure has reportedly not improved significantly since the 1960s.

Solid state refrigerators have an advantage with respect to their compressor-driven counterparts. This advantage is miniaturization. For example, a temperature reduction of as much as 150° C. can be achieved with a conventional thermoelectric refrigerator that requires no circulating fluids and whose dimensions are in the order of a few centimeters. An increase in the efficiency of thermoelectric refrigerators, however, would render them suitable for a wide range of household and industrial applications that are presently excluded from the realm of thermoelectric applications.

The thermionic devices according to the present invention are not limited by materials science and technology. In particular, this invention provides the methodology for separating the thermal insulation and electric conduction functionalities. Devices according to the present invention include multi-element solid state devices with improved efficiencies.

The description of embodiments according to the present invention is accompanied below by the disclosure of models, reasoning, and approximations related to thermionic and thermoelectric materials. The present invention, however, is not limited by any specific model, theory or approximation. The models, reasoning, and approximations set forth in the following sections are provided as a supplementing tool, so that the described embodiments together with such models, reasoning and approximations permit a person of ordinary skill in the art to supplement the described embodiments with additional embodiments that are within the scope of the present invention. Accordingly, the following material is divided in three sections. This division is intended only for the purpose of arranging the following written description, but it is not meant to imply any limitation to its interpretation and its teachings, which are to be interpreted in light of the entire disclosure.

Section two summarizes results for a one dimensional model of a refrigerator in a thermal diode design. Although only phenomena related to the emitter, gap and collector regions of the semiconductor are considered in this model, external effects are not necessarily negligible. This section also summarizes the results showing that the inclusion of the complete circuit in the design and analysis of solid state refrigerators leads to a better approach to design optimization.

The third section provides a picture unifying the description of thermionic and thermoelectric devices, and the fourth section describes multi-element refrigeration devices and methods for their design.

2. One Dimensional Models of Solid-State Refrigerators and System Considerations Refrigeration is intimately related to power generation. Numerical work performed in the context of developing this invention indicates that the fraction of the Carnot limit which can be obtained in refrigeration and power generation are comparable in the vicinity of room temperature.

A simple analytic one dimensional model for a refrigerator was considered in which the thermal diode was modeled as a simple resistor in its electrical characteristic and the barrier cooling and dissipation effects were included, but recombination effects were neglected. The results indicated that in this model the current is primarily determined by the ohmic resistance of the gap region and nearly independent of the barrier under conditions of interest for refrigeration.

The simple one dimensional model provides some insight into some physical variables, but if focuses only on the emitter, the gap and the collector regions of the semiconductor. All external effects are neglected in such model. However, other issues are attended to in a physical implementation. For example, there is a wire extending from the source (assumed to be at room temperature) to the emitter (assumed to be cold) and this wire supports a heat flow. It was found in the context of this invention that this heat flow contribution is generally non-negligible. This wire was treated in the present context as a thermoelectric and it was included in the circuit on an equal footing with an n-type thermal diode. It was found that such wire could be approximately considered as a subset of p-type thermal diodes, mainly characterized by its normalized thermal conductivity.

Furthermore, it was found that the complete circuit should preferably be included in the design and analysis of refrigeration systems to minimize the end-point temperature. This temperature is defined as the lowest temperature that the thermal diode can reach under filly optimized conditions.

It was also found in this treatment that refrigerator design should preferably include the thermoelectric aspects as well as the barrier cooling effects and include the entire circuit. It is in this context that the picture described in the following section was developed.

3. Unified Picture of Thermionic and Thermoelectric Devices

As indicated in the previous section, the combination of a proposed thermionic refrigeration element in the same circuit with a wire which acts as a thermoelectric unit was considered. A unified view of thermoelectrics and thermionics was developed to aid in the development of models and in the evaluation of proposed designs.

The thermoelectric version of refrigeration starts with the physics that underlies the Peltier coefficient in a metal or in a highly doped bulk sample of a thermoelectric semiconductor. As indicated above, carriers carry heat when they flow. Peltier coolers become possible when heat is carried away from a junction in both directions, when a current of single direction is flowed through. This is the embodiment discussed in foregoing section 1. For example, electrons flowing in one direction away from the junction take away heat. Holes flowing away in the other direction also take away heat, but the sense of the current flow is different because of the different carrier charge. Within this picture, there is no room for barrier offsets, as the entire effect arises from the thermal energy transported per carrier.

The thermionic version of the effect is due to the presence of a barrier that is arranged for by design. Within a semiconductor that has an n*n barrier or an n*p junction, the difference in doping levels produces a barrier. That barrier can act on carriers which move to give rise to current flow. Carriers that move up a potential barrier lose thermal energy and are cooled. This is the essence of thermionic cooling, as is thought at the moment to be a distinct effect from thermoelectric Peltier cooling. Nevertheless, and for the purpose of mathematical treatment, it is possible to think of the difference between Peltier coefficients as arising from a barrier between metals. Alternatively, and more consistently with the thermodynamic interpretation of a Peltier coefficient, the cooling effect due to current flow across a potential barrier could be viewed as being due to a difference in Peltier coefficients.

A formulation was developed in the context of this invention to handle the thermoelectric Peltier physics on the same footing as the thermionic barrier physics. This formulation permits to understand cooling circuits much better. Furthermore, the methodology developed in light of this formulation permits the design of thermionic circuits using insight from the formulation for thermoelectrics.

In what follows, we examine the various definitions of the Peltier coefficient. We find that the Peltier coefficient encompasses the thermionic contribution, but that the associated physics is at variance with what is commonly understood to be the Peltier effect. A formulation is then developed to separate more cleanly the barrier effects from the thermoelectric effects.

Experiments on thermal diodes for energy conversion have shown violations from the conventional (thermoelectric) Onsager current and voltage relation in the presence of a temperature gradient. Violations of the Onsager current and voltage relation are present in obtaining a non-thermoelectric refrigeration effect. Hence the thermal to electric conversion experiments are supportive of the existence of an equivalent refrigeration effect.

It is believed that a model that could explain the operation of the thermal diode includes ballistic transport across a potential barrier of electrons from a heavily-doped emitter region, thermalization on the other side, and subsequently either the return to the emitter or the diffusion to the collector. This operation has been described in the context of the present inventive work in terms of a current injection effect, in which the electron distribution in the emitter region deviates from a Fermi-Dirac distribution due to the presence of a substantial thermopower, and the non-Fermi-Dirac parts of the distribution on either side of the junction do not balance. Hence, the origin of the violation of the thermoelectric Onsager current and voltage relation for the thermal device is viewed by way of explanation, but not as a limitation, as primarily due to a current injection effect.

The existence of an enhanced open-circuit voltage is viewed as being due to the presence of an enhanced ohmic return current to give zero total current. Internal charge build-up within the device leads to an internal field sufficient to drive the return current, and shows up at the terminal leads as an open-circuit voltage.

This enhanced open-circuit voltage leads to the development of a potential contribution to the effective Peltier coefficient needed for the new refrigeration schemes described above. The part of the open-circuit voltage which is above and beyond the thermoelectric open-circuit voltage is due to an internal potential which is not present in a thermoelectric, and which can produce cooling enhancements.

Implementation of Non-Thermoelectric Potentials in Refrigeration Structures

A potential barrier greater than that due to thermoelectric effects is to be generated to implement thermoelectric potentials in refrigeration structures. Two ways to do this are described below by way of examples.

In a first example, an emitter layer is put next to a solid-state gap region which injects current above the thermoelectric current in the presence of a Fermi level gradient. By way of explanation, but not as a limitation, it is believed that the second-order thermionic current injection effect depends on developing a significant non-Fermi-Dirac component of the distribution, in the neighborhood of a junction that is sharp compared to a mean-free path, and with an emitter layer that is at least 2–3 scattering lengths thick. Consistently with this explanation, an additional nonthermoelectric current and an electrostatic potential should be induced. The additional nonthermoelectric current is helpful for refrigeration, and the electrostatic potential tends to oppose the injection. Furthermore, this electrostatic potential is comprised in the model for the development of enhanced cooling.

In a second example, two materials are arranged on either side of a junction which end up injecting electrons forward from the cold side of the junction, or holes from the hot side of the junction, as part of a second-order thermionic injection effect due to the thermopower of the materials on either side of the junction. In this case, the "backwards" injection will produce a nonthermoelectric potential which will be oriented so as to cool a forward electron current.

The injected current according to each one of these approaches can be promoted in at least two different ways. To impact the electron distribution based on linearized transport theory, one way is to use the thermopower in the presence of a temperature gradient. Another way is to use the conductivity in the presence of a gradient in the Fermi level. These approaches are envisaged within the scope of the present inventive work.

Extension to a p-Type Leg

Some skudderite semiconductors have band structures that are complementary to the zinc-blende family of semiconductors such as InSb. These materials are envisaged in some embodiments of the present invention as comprised in p-type thermal diode structures. The schemes described hereinabove are understood to provide methodology for developing p-type refrigeration legs by replacing electrons with holes throughout in the above discussion.

Examination of the Peltier Coefficient

The Peltier coefficient can be viewed as being made up of a potential energy component and a kinetic energy component. These two components were separated and the ensuing provided a useful view of thermoelectric and thermionic devices on a unified basis.

Thermodynamic Relations

We begin by considering the basic thermodynamic relations in which the Peltier coefficients appear. In the article of Parrott [*IEEE Trans. on Electronic Devices*, 43, p. 809 (1996)], we find the following basic components of the current and heat flow relations for a semiconductor in the presence of a thermal gradient:

$$J_e = \sigma_e \left[ \frac{\nabla \varepsilon_F^e}{q} - \sum_e \nabla T \right] \quad (3.1)$$

$$J_h = \left[ \frac{\nabla \varepsilon_F^h}{q} - \sum_h \nabla T \right] \sigma_h \quad (3.2)$$

$$Q = -\kappa \nabla T + \Pi_e J_e + \Pi_h J_h \quad (3.3)$$

Here $\Pi_e$ is the electron Peltier coefficient, and $\Pi_h$ is the hole Peltier coefficient. There appear also in these equations the Seebeck coefficients for electrons $\Sigma_e$, and for holes $\Sigma_h$. The symbol (refers to electric conductivity, the symbol κ refers to thermal conductivity, $\epsilon_F^e$ is the Fermi level for electrons, and $\epsilon_F^h$ is the Fermi level for holes. The Peltier and Seebeck coefficients are related through:

$$\Pi_e = T\Sigma_e \quad (3.4)$$

$$\Pi_h = T\Sigma_h \quad (3.5)$$

The heat flow relation can also be written in terms of the total current J according to:

$$Q = -\kappa \nabla T + \Pi J - \psi \nabla \phi \quad (3.6)$$

Here, we have the total Peltier coefficient Π, which is composed of the electron and hole Peltier coefficients through:

$$\Pi = \frac{\sigma_e \Pi_e + \sigma_h \Pi_h}{\sigma + \sigma_h} \quad (3.7)$$

Expressions for the Peltier Coefficients from Transport Theory

We consider first the case of bulk material. Starting from the Boltzmann equation in the bulk, a linearization of the transport problem leads eventually to a linearized expression for the Peltier coefficients for electrons and holes. We adapt the results given by H. J. Goldsmid [*Thermoelectric Refrigeration*, Plenum Press (1964)].

$$\Pi_e = -\frac{1}{q} \left[ \varepsilon_F^e - \frac{\int_{-\infty}^{\infty} g_c(\varepsilon) \tau(\varepsilon) \varepsilon^2 \left( \frac{\partial f_0}{\partial \varepsilon} \right) d\varepsilon}{\int_{-\infty}^{\infty} g_c(\varepsilon) \tau(\varepsilon) \varepsilon \left( \frac{\partial f_0}{\partial \varepsilon} \right) d\varepsilon} \right] \quad (3.8)$$

$$\Pi_h = \frac{1}{q} \left[ \varepsilon_F^h - \frac{\int_{-\infty}^{\infty} g_v(\varepsilon) \tau(\varepsilon) \varepsilon^2 \left( \frac{\partial f_0}{\partial \varepsilon} \right) d\varepsilon}{\int_{-\infty}^{\infty} g_v(\varepsilon) \tau(\varepsilon) \varepsilon \left( \frac{\partial f_0}{\partial \varepsilon} \right) d\varepsilon} \right] \quad (3.9)$$

We note that the linearized expressions for the Peltier coefficients as written here are composed of two different kinds of terms. The terms containing the integrations over the conduction and valence bands are associated with the kinetic energy of the transported carriers. The terms containing Fermi energies are associated with the potential energy of the carriers. This separation of the problem into kinetic and potential energy terms is advantageously used here.

Separation of the Kinetic and Potential Energy Components

In this context, thermoelectric thermal circuits are dominated by the kinetic energy contribution to the Peltier coefficient and thermionic systems are dominated by the potential energy contribution to the Peltier coefficient. Although this view can be further refined, it provides a useful picture.

The connection between the thermoelectric and thermionic thermal circuits was established in terms of the following separation:

$$\Pi_e = \pi_e - \frac{\varepsilon_F^e}{q} \quad (3.10)$$

$$\Pi_h = \pi_h + \frac{\varepsilon_F^h}{q} \quad (3.11)$$

The new lower case $\pi_e$ and $\pi_h$ coefficients will then refer to the kinetic energy contributions of electrons and holes, respectively.

A Simple Model for a Two-Element Refrigeration Circuit

We now return to the problem of optimizing simple refrigeration circuits. We consider an n-type side and a p-type side, where the designations refer to the functionality rather than the implementation. For example, the n-type side comprises in one embodiment an n-type thermoelectric, such as n-type PbTe. In another embodiment, the n-type side comprises an n region of an n*n thermal diode. The p-type region comprises in one embodiment a p-type thermoelectric, such as p-type PbTe. In another embodiment, the p-type side might comprise the n*half of a thermal diode. In the case of the thermoelectric, an ohmic contact separates the two regions as indicated in FIG. 3.1. In the case of a thermal diode, there is no contact as indicated in FIG. 3.2. As shown below, a single model was used on an equal footing for the two very different types of circuits.

Voltage and Current

To simplify the model as much as possible, it was assumed that the current, I, and voltage, V, relation remains approximately linear:

$$V = \left[\frac{L_n}{A_n \sigma_n} + \frac{L_p}{A_p \sigma_p}\right] I \quad (3.12)$$

This neglects thermally-induced current terms. The subscripts n and p refer, respectively, to n-type and p-type elements, $L_n$ refers the n layer equivalent length, and $A_n$ refers to the n layer equivalent cross section, with the corresponding analogous meanings for $L_p$ and $A_p$ as applied to the p layer.

Heat Flow

The integrated heat flow out of the junction surface area is:

$$\int Q_{in} dA = Q_n A_n - Q_p A_p \quad (3.13)$$

Here it was assumed that there is an external power source (such as a load) into the junction $\int Q_{in} dA$. There is also the heat flow from the p side, and the heat flow into the n side. The two sides were modeled including thermal conduction, dissipation; and also other effects were included through the use of the Peltier coefficients, finally obtaining:

$$\int Q_{in} dA = -\left[\frac{A_n \kappa_n}{L_n} + \frac{A_p \kappa_p}{L_p}\right](T_{max} - T_{min}) + [\Pi_p - \Pi_n]\left[\frac{L_n}{A_n \sigma_n} + \frac{L_p}{A_p \sigma_p}\right]^{-1} V - \frac{1}{2}\left[\frac{L_n}{A_n \sigma_n} + \frac{L_p}{A_p \sigma_p}\right]^{-1} V^2 \quad (3.14)$$

Regarding the signs in this equation, power into the junction is negative, so that the net heat flow from the room temperature source is negative. The relative signs of the Peltier coefficients depend on the orientation of n-type and p-type regions relative to the voltage source. In this case, the signs are such that the application of a positive voltage leads to cooling. It was assumed for simplicity that half of the dissipated power flows into the junction from either side.

Optimization of Cooling Power

Optimization of the cooling power with respect to voltage is determined by the condition:

$$\frac{\partial}{\partial V} \int Q_{in} dA = 0 \quad (3.15)$$

In this case, a voltage at the optimum was obtained as:

$$V = \Pi_p - \Pi_n \quad (3.16)$$

At the optimum voltage, it was further found that:

$$\int Q_{in} dA = \quad (3.17)$$
$$-\left[\frac{A_n \kappa_n}{L_n} + \frac{A_p \kappa_p}{L_p}\right](T_{max} - T_{min}) + \frac{1}{2}[\Pi_p - \Pi_n]^2\left[\frac{L_n}{A_n \sigma_n} + \frac{L_p}{A_p \sigma_p}\right]^{-1}$$

The End-Point Temperature

The end-point temperature in the absence of a thermal load within the framework of this simplified model can be obtained through:

$$T_{max} - T_{min} = \frac{\frac{1}{2}[\Pi_p - \Pi_n]^2}{\left[\frac{A_n \kappa_n}{L_n} + \frac{A_p \kappa_p}{L_p}\right]\left[\frac{L_n}{A_n \sigma_n} + \frac{L_p}{A_p \sigma_p}\right]} \quad (3.18)$$

The temperature difference is quadratic in the difference in Peltier coefficients for thermoelectric problems; or equivalently, quadratic in the barrier height in the case of thermionic problems.

Optimization of the Geometry

The end-point temperature was minimized by selecting optimum relative geometric parameters. The temperature difference is written as:

$$T_{max} - T_{min} = \frac{1}{2}\frac{[\Pi_p - \Pi_n]^2}{\frac{\kappa_n}{\sigma_n}\left[1 + \frac{A_p L_n \kappa_p}{A_n L_p \kappa_n}\right]\left[1 + \frac{A_n L_p \sigma_p}{A_p L_n \sigma_n}\right]} \quad (3.19)$$

The geometry parameter $\xi$ is defined as:

$$\xi = \frac{A_p L_n}{A_n L_p} \quad (3.20)$$

which allows us to write:

$$T_{max} - T_{min} = \frac{1}{2}\frac{[\Pi_p - \Pi_n]^2}{\frac{\kappa_n}{\sigma_n}\left[1 + \xi\frac{\kappa_p}{\kappa_n}\right]\left[1 + \frac{1}{\xi}\frac{\sigma_p}{\sigma_n}\right]} \quad (3.21)$$

The temperature difference is maximized when $\xi$ takes on the value:

$$\xi = \sqrt{\frac{\sigma_n}{\sigma_p}\frac{\kappa_p}{\kappa_n}} \quad (3.22)$$

The resulting optimized temperature difference at the end-point was found to be:

$$T_{max} - T_{min} = \frac{1}{2} \frac{[\Pi_p - \Pi_n]^2}{\left[\sqrt{\frac{\kappa_n}{\sigma_n}} + \sqrt{\frac{\kappa_p}{\sigma_p}}\right]^2} \quad (3.23)$$

This expression applies to thermoelectric cooling circuits and, because the difference in Peltier coefficients can also include potential energy differences, this expression also applies to thermionic systems.

Thermoelectric Limit

In the limit case of a thermoelectric system in which the thermoelectric effect is due entirely to the kinetic energy component of the Peltier coefficient, the difference in Peltier coefficients for the two segments is replaced with the kinetic part:

$$\Pi_p - \Pi_n \to \pi_p - \pi_n \quad (3.24)$$

In this case, the optimized temperature difference at the end-point temperature is given by:

$$T_{max} - T_{min} = \frac{1}{2} \frac{[\pi_p - \pi_n]^2}{\left[\sqrt{\frac{\kappa_n}{\sigma_n}} + \sqrt{\frac{\kappa_p}{\sigma_p}}\right]^2} \quad (3.25)$$

All parameters here are determined by physical (thermoelectric) properties of the bulk material out of which the two segments are constructed.

Thermionic Limit

When the refrigeration is completely thermionic, the kinetic parts of the Peltier coefficients are in this limit identical in the two regions. Consequently, all of the cooling is due to barrier physics. In this limit, and denoting the electron Fermi levels for the emitter (n*) and for the gap (n) as $\epsilon_F^e[n^*]$ and as $\epsilon_F^e[n]$, respectively, the electronic charge as q, and the barrier height as $\phi_b$, we may write:

$$\Pi_p - \Pi_n \to \frac{\varepsilon_F^e[n^*]}{q} - \frac{\varepsilon_F^e[n]}{q} = \phi_b \quad (3.26)$$

Consequently, the optimized temperature difference in this context at the end-point for a thermionic refrigeration system was obtained as:

$$T_{max} - T_{min} = \frac{1}{2} \frac{\phi_b^2}{\left[\sqrt{\frac{\kappa_n}{\sigma_n}} + \sqrt{\frac{\kappa_{n^*}}{\sigma_{n^*}}}\right]^2} \quad (3.27)$$

where $\kappa_n$ and $\kappa_{n^*}$ denote the thermal conductivities of the gap and the emitter, respectively, and $\sigma_n$ and $\sigma_{n^*}$ denote the electrical conductivities of the gap and the emitter, respectively.

This expression is closely related to what was obtained above for a two-sided thermionic refrigeration system. The barrier height should be low enough to provide reasonable current, i.e., a preferred value is about 100 meV at room temperature, and a preferred value in terms of the temperature is about 4 $k_B T$.

Thermoelectric and Thermionic Systems are Closely Related

One observes the close connection between the two different types of systems. The temperature difference at the end-point temperature is proportional to the square of the strength of the material discontinuity—the differential kinetic part of the Peltier coefficient in the one case, and the barrier height in the other case. Conduction of heat to the junction, and dissipation in the two legs of the refrigerator otherwise work the same in the two cases. This is reflected in the identical geometry optimization in the two cases, and the appearance of identical denominator terms in the different limits. The close physics connection between the two types of systems is reflected in the mathematics within this formulation.

When carrier diffusion is important in the problem, this picture should preferably be modified mainly in the sense that some of the applied voltage appears across the barrier. Otherwise, the arguments presented here would apply rather well.

Discussion

The arguments developed in this section clarify the connection between thermionic and thermoelectric refrigeration systems. As noted in foregoing Section 2, it is preferable to include in the analysis current legs both to and from the voltage source. Upon doing so, the resulting optimization problem turned out to be quite close to the conventional thermoelectric analysis for a two-sided cooling system. It was found that although the Peltier coefficient is usually understood to be primarily a kinetic effect in conventional thermoelectric refrigeration systems, the thermodynamic definitions in fact include a potential effect on equal footing. This permits the adoption of a formulation to analyze the two different classes of refrigeration system on an equal footing.

In this context, a thermionic system is preferably regarded as one in which the energy conversion or refrigeration effect is due primarily to the potential part of the Peltier coefficient.

In a conventional thermoelectric view of such systems, the basic effect is associated with a junction between two materials, and only the materials parameters are important. Research toward improving such systems is then materials science oriented. In contrast, the cooling physics, which is determined by either kinetic or potential effects in the Peltier coefficient, is in the context of this invention separated from the thermal and electrical conduction physics associated with each leg. Accordingly, there is room in the context of the present invention for design beyond the realm of materials science. This invention provides the ability to freely develop barriers independently of the physics that governs the conduction processes.

4. Multi-Element Refrigerators

In light of the results obtained in the foregoing section, thermionic refrigeration devices and design methods are developed in the context of the present invention in terms of a plurality of functional parts, preferably in terms of three functional parts.

In a two-element thermoelectric design, the cooling mechanism consists of the presence of a mismatch in the kinetic part of the Peltier coefficient at the junction. Heat flow to the junction from the source is constrained by whatever thermodynamic efficiency is available in the n-type and p-type legs of the system. Each leg must do double duty in this kind of design. Thus conventional design focuses accordingly on a maximized differential Peltier coefficient at the junction (since the effects are proportional to the square of this quantity), and on each leg having good electrical conduction and poor thermal conduction. Only a relatively small number of thermoelectric materials are capable of doing a passable job of meeting all of these constraints at the same time. Moreover, if a material is found that does a particularly good job on the n-type side, this favorable feature is typically compromised if there is not an equivalently good material that can be used on the p-type side. There exist in fact a number of materials with rather good n-type characteristics. But complementary materials with equivalently good p-type characteristics seem to be more difficult to find.

Conventional thermionic designs are characterized by the same shortcoming. Designs are developed that implement significant potential barriers. In addition, barrier materials can be selected with good electrical conductivity and poor thermal. The preferred ratio of high electrical conductivity to low thermal conductivity comes at high doping. However, there must be a region of low doping to sustain a potential barrier at the junction. Maximizing the potential barrier comes at a cost of dropping the electron density in the n region by an order of magnitude or more. The ability to isolate the different functionalities in the context of the present invention leads to a significant improvement upon the conventional design.

According to the present invention, the temperature drops are preferably sustained across the most thermodynamically efficient material available, such as an n* material. Examples of this material for a wire-equivalent segment include highly doped HgSe, HgCdTe or Bi. Metals also serve as efficient materials in this sense.

The barrier according to the present invention is preferably implemented in a narrow region. Idealized ohmic contacts between the different regions isolate them from each other in terms of functionality. The preferred design according to the present invention comprises a three-element design see FIG. 4.1, that provides the functionality of a wire, a barrier, and then a wire.

An embodiment of a three-element thermionic refrigerator is schematically illustrated in FIG. 4.1. In this treatment, the wire equivalent segments are assumed to sustain both a temperature drop as well as a voltage drop. Heat flow and electrical power dissipation are included. The region with the potential barrier is assumed much shorter than the wire equivalent regions, so that the temperature drops and associated thermal conduction physics can be ignored. The barrier gives rise to a cooling effect when current flows, which is included. Any voltage drop across the barrier of the externally applied voltage is considered negligible. This is applicable, for example, to a situation in which the barrier is implemented by using an n*n junction, with a highly doped n-region. In this context, embodiments of thermionic refrigerators are designed with as many junction regions as desired, so that the total barrier height is set independently of whatever relative doping is adopted in one junction.

Potential Barrier

The potential barrier is built attending to barrier height considerations. The shape of the potential barrier further leads to variations in potential barrier embodiments, although the potential barrier height provides the primary effects. Preferred barrier heights in terms of the temperature T at the barrier material are of a few $k_B T$, typically from about 2 $k_B T$ to about 7 $k_B T$, more preferably from about 4 $k_B T$ to about 5 $k_B T$; preferred barrier heights are about 100 meV at room temperature. Preferred barrier heights at lower temperatures change approximately linearly with respect to temperature with a slope sign that depends on the material. This behavior with respect to temperature for a refrigerator can be attended to in ways such a by changing the applied voltage, by selecting materials for which the barrier height increases with respect to temperature, and combinations thereof. For example, the band gap for semiconductors such as HgTe and HgSe increases as the temperature increases. Because the barrier height depends on the band gap, the barrier height for such materials also increases as the temperature increases.

Potential barriers such as those referred to above are considered in the art small potential barriers. This type of potential barriers can be built according to procedures such as variable doping, and forming barriers including Shottky barriers, semiconductor heterojunction barriers, resonant tunneling barriers, and fractional contact barriers. The variable doping approach is described in U.S. patent application Ser. No. 09/721,051, entitled Thermal Diode For Energy Conversion, which is incorporated herein by reference, and barrier formation including Shottky barriers, semiconductor heterojunction barriers, resonant tunneling barriers, and fractional contact barriers, is described in U.S. patent application Ser. No. 09/519,640, entitled Hybride Thermionic Energy Converter And Method, which is incorporated herein by reference. These are examples of procedures for building barrier heights such as those referred to above and, for example, barriers of about 100 meV barrier height.

Another procedure for building a barrier according to the present invention is to use a material that has the properties of the class of materials known as cermets or granular metals (P. P. Edwards and C. N. R. Rao, *Metal Insulator Transitions Revisited*, Taylor & Francis (1995)). Cermets have finely divided two-phase mixtures of metal and non-metal constituents. When the metal concentration is small, the metal forms small isolated islands embedded in an insulating matrix, and the electrical conductivity is small and must be activated by an external electric field. Electrons in these materials tunnel from one island to another, a phenomenon known as hopping conductivity. Preferable materials of this type include those whose activation field is of the order of the barrier heights referred to above, including about 100 meV. Typical metal particle size in these materials is a few nanometers, with about the same spacing between particles. Specific resistance of cermets is typically about $10^3$ times higher than for metals, which implies that cermet barriers should be relatively thin in order to have a resistance smaller than the wire equivalent. Under these conditions, a cermet barrier can work in the same way as a semiconductor barrier.

An attractive feature of cermet barriers is their environmentally neutral character, because they can be obtained with materials such as $SiO_2$, $Al_2O_3$, and non-toxic metals. In addition, cermets typically do not need a diffusion barrier like semiconductors do, and they are basically immune to electromigration, which translates into long operation times.

Still another procedure for building a barrier according to the present a invention is to resort to limit strategies. These strategies include the use of a barrier such as a completely dielectric barrier and a vacuum barrier. Utilization of this type of barriers is shown, for example, in T. T. Coutts, *Electrical Conduction in Thin Metal Films*, Elsevier (1974).

Semiconductors with large band gap can be regarded as dielectrics in the context of the present invention. These materials are characterized in that, depending on the dielectric, interface potential barrier height is a few electronvolts when the dielectric layer between two metal contacts is thick, such as thicker than about 100 Å. This barrier can be dramatically reduced by an image force effect.

The potential of an electron in a dielectric between two metal plates is approximately given by the following expression:

$$\varphi(x) = \phi - \frac{e}{4\pi\varepsilon_0\varepsilon_n S} \frac{1}{1 - 4\frac{x^2}{S^2}} \quad (4.1)$$

where $\Phi$ is the interface barrier, S is the distance between the plates, $\epsilon_o$ is the vacuum dielectric constant, e is the electron charge, and $\epsilon_r$ is the dielectric constant of the dielectric. For example, for $\epsilon_r=5$ and S=20 Å, the reduction in the barrier height midway between metal plates is 0.144 eV. Significant barrier reduction in this case is expected only at a dielectric thickness of a few Ångstroms.

Vacuum is also a dielectric and the immediately preceding formula applies to it. In the case of vacuum, $\epsilon_r=1$ and interface barrier (electron work function) can be reduced to about 1.2 eV–1.3 eV by coating silver or platinum oxide with cesium. In this case, a suitable barrier can be achieved at spacings in the range from about 25 Å to about 30 Å. Spacers of this size are marginally within the reach of modem technology. Vacuum gap is related to conventional thermionics, and refrigeration can also be achieved at larger spacings and higher applied voltages, but efficiency in such embodiments is expected to be lower.

Current and Voltage Relation

We assume for simplicity that the two wire equivalent legs are made out of the same material, which will lead to the removal of any net contributions from differential kinetic Peltier terms. The overall current and voltage relation becomes:

$$V = 2\frac{L}{A\sigma}I \quad (4.2)$$

where L, A and $\sigma$ are referenced to the wire equivalent regions.

Heat Flow

The heat flow balance at the junction can be developed as before. We may write:

$$\int Q_{in} dA = \quad (4.3)$$
$$-2\frac{A\kappa}{L}(T_{max} - T_{min}) + [\Pi_{n^*} - \Pi_n]\left[2\frac{L}{A\sigma}\right]^{-1} V - \frac{1}{2}\left[2\frac{L}{A\sigma}\right]^{-1} V^2$$

The relative signs are defined here similarly as before. On the left hand side, thermal conduction from the room temperature source comes in with a minus sign, as heat is being brought to the junction from the outside. Similarly, dissipation due to current flow in both legs gives rise to heat flow into the junction. Once again, we assume that roughly half of this heat makes it to the junction. Cooling at the junction comes about through an $I\Delta\Pi$ term, the sign of which is determined by the directionality of the junction.

Optimization of the Applied Voltage

We optimize the heat flow at the junction by making the incoming power m stationary with respect to the applied voltage:

$$\frac{\partial}{\partial V} \int Q_{in} dA = 0 \quad (4.4)$$

This leads to the optimum voltage:

$$V = \Pi_{n^*} - \Pi_n = \phi_b \quad (4.5)$$

Under optimum conditions, the heat flow into the junction is:

$$\int Q_{in} dA = -2\frac{A\kappa}{L}(T_{max} - T_{min}) + \frac{1}{2}\frac{\phi_b^2}{\left(\frac{2L}{A\sigma}\right)} \quad (4.6)$$

According to this relationship, the cooling power is proportional to the square of the barrier. Heat flow comes in as before, and the parallel resistance of the two legs appearing in the denominator.

As indicated above, the functionality of the different components of the system has been separated in this treatment. The appearance of the barrier in the expression is not apparently constrained by the wire equivalents. Accordingly, barrier selection can be done as needed in the context of this invention. The electrical resistance of the wire equivalents can also be selected independently, although we are constrained as the heat flow from the outside also appears in the expression. In any event, this result demonstrates that we have succeeded in our stated goal of separating and isolating the functionality of the different parts of the system.

The End-Point Temperature

The end-point temperature for this system is determined by the condition that no heat flow from the cold sample is input into the junction:

$$\int Q_{in} dA = 0 \quad (4.7)$$

The temperature difference between the maximum temperature $T_{max}$ (which we are imagining is room temperature), and the minimum temperature is:

$$T_{max} - T_{min} = \frac{1}{8}\frac{\phi_b^2}{\left(\frac{\kappa}{\sigma}\right)} \quad (4.8)$$

This is a very useful result.

Initial Examination of Designs

The results are used for the development of a new class of refrigeration systems. In this section, we will begin examining a number of examples of such designs. These designs focus on the development of a suitable barrier, and the selection of a good wire equivalent material.

We have previously explored the possibility of using doping in semiconductors as a way to develop a barrier at an n*n or a n*p junction. As we will see shortly, relevant barrier heights in the general neighborhood of 100 meV are of interest. Near room temperature, it should not be difficult to find materials which exhibit such barriers. However, these thermal circuits should be able to cool down to well under 200 K, and at some point the ionization of the donors will become a problem. In this case, it seems that using a junction between two different alloys should produce more reliable results. Such an approach is used to develop barriers in quantum well technology, and these barriers are known to exist down to absolute zero. One example that is relevant here is the use of HgSe and HgSe:Fe quantum wells which have become of interest recently in the literature. Relative to the present discussion, HgSe is an exceedingly efficient material thermodynamically for our applications. Near room temperature, barrier heights on the order of 200 meV have been reported. This would seem to provide a near ideal solution, assuming that the barrier height for these materials does not change too much as the temperature is reduced. There is a potential for a problem with the conductivity if HgSe cannot be doped, unless the width of the barrier region is made to be quite small. Implicit in the discussion is the assumption that materials suitable for ohmic contacts can be found.

Consequently, the most interesting part of the problem that remains (at this simple level) is the selection of material for the wire equivalent legs of the design. In what follows, we have evaluated the performance of three different candidate materials. The results suggest that such devices should work very well, and in doing so far exceed the capabilities of existing thermoelectric refrigeration systems.

We first examine InSb as a candidate for a wire equivalent material. InSb doped n-type to $3.5 \times 10^{18}$ cm$^{-3}$ has been used in the context of the present invention. In FIG. 4.2 we illustrate results for InSb as a function of the electron density of the InSb, and the barrier height of whatever material is used at the junction. The results are presented in terms of the end-point temperature under optimum conditions, as given by the model above.

This result is obtained by using an estimate for the ratio of $\kappa/\sigma$ at the midpoint temperature:

$$T_{mid} = \frac{T_{min} + T_{max}}{2} \quad (4.9)$$

and iterating to find a self-consistent solution.

The results indicate that InSb doped at about $3.5 \times 10^{18}$ is a preferred material, according to this simple model. To develop a barrier height in the vicinity of 200 meV to 250 meV in a junction (or in a series of junctions) should certainly be possible. Consequently, a design based on InSb is envisaged in the context of this invention as an improvement over the performance of the best thermoelectric single stage coolers.

HgCdTe as a Wire Equivalent

Mercury cadmium telluride, $Hg_{1-x}Cd_xTe$, is another material used in the context of this invention. For example, $Hg_{1-x}Cd_xTe$ that is lightly doped with x in the range of 0.14 to 0.18 has been used in designs according to this invention. The doping in some embodiments was about $10^{17}$ cm$^{-3}$. Mercury cadmium telluride was found to give superior results for energy conversion using a solid state thermionic energy conversion scheme, and it is herein applied to refrigeration. In FIG. 4.3 we present results for $Hg_{0.80}Cd_{0.2}Te$.

The results indicate that mercury cadmium telluride is a preferred material for serving as an equivalent wire in a three element refrigeration scheme. However, other preferred materials are envisaged as being more heavily doped.

Bi as a Wire Equivalent

In another example, we consider the use of bismuth as a wire equivalent. Bismuth is interesting as it has appeared to be among the better materials for refrigeration applications that we have examined so far. We plot results as above in FIG. 4.4 for a bismuth wire equivalent. We see that bismuth is characterized by an excellent performance.

We have considered above the use of semiconductor materials for the wire equivalent legs of the three element design. In this section, we consider the use of metal wires.

Ratio of Thermal to Electrical Conductivity

Wire equivalent materials include substances comprising at least one of a metal, semimetal, electric conductor, and semiconductor with a high $\kappa/\sigma$ ratio. Metals can be extremely good electrical conductors, so that the ratio of the thermal conductivity to electrical conductivity may be low. In light of the Wiedemann-Franz law, we expect that this ratio should be similar for different metals, as well as for the high mobility semiconductors that we have considered.

We plot the ratio of $\kappa/\sigma$ in FIG. 4.5 for several metals. We see that this ratio is rather similar for the metals considered. This ratio is also reasonably close to the same ratio obtained for the semiconductor examples with the highest electron mobilities at high donor dopings.

Peltier Coefficients

Metals have finite Peltier coefficients. It is useful to include the effects of the Peltier coefficients of the metal into the estimate for the end-point temperature. Let us use the new formalism as developed above, including the view that the Peltier coefficients for the metals are predominantly kinetic in origin, to write:

$$T_{max} - T_{min} = \frac{1}{8} \frac{[\phi_b + \Delta \pi]^2}{\left(\frac{\kappa}{\sigma}\right)} \quad (4.10)$$

This formula presumes that the ratio $\kappa/\sigma$ is essentially the same for the two metals (see FIG. 4.5), and that the relative length to area ratio is appropriately optimized. Of interest here is to see what kind of differential Peltier coefficient is available from the metals. In FIG. 4.6 we illustrate results for the Peltier coefficients for four metals. We see that it is possible to arrange for a differential Peltier coefficient of perhaps a few mV. This is in comparison to the barrier height $\phi_b$, which we can arrange to be on the order of 100 mV or larger. Consequently, for large $\phi_b$, we do not err greatly by neglecting the contribution of the Peltier coefficients of the metals.

End-Point Temperature for Metal Wire Designs

In FIG. 4.7, we illustrate the end-point temperature as a function of barrier height $\phi_b$, computed from:

$$T_{max} - T_{min} = \frac{1}{8} \frac{\phi_b^2}{\left(\frac{\kappa}{\sigma}\right)} \quad (4.11)$$

The Peltier contribution from the metal is neglected. As the ratio of $\kappa/\sigma$ is similar for many metals, this curve is essentially a universal curve. It was constructed using data for copper. As before, we evaluate the ratio of $\kappa/\sigma$ at the midpoint temperature $T_{mid}=(T_{max}+T_{min})/2$, using 300 K for the maximum temperature, and iterating to find the end-point temperature $T_{min}$.

EXAMPLE OF THE IMPLEMENTATION OF THE SCHEME

The results obtained above are implemented into physical devices in generating examples of embodiments according to the present invention. FIG. 4.8 schematically shows one of such embodiments. In this case, a voltage supply at room temperature drives two cooling units, much like n-type and p-type thermoelectric cooling units. In this case we have implemented potential barriers at the end of each unit, oriented so as to cool the sample. Note that as there are two barriers in this case, the cooling power is increased correspondingly. The associated end-point temperature in this case will be given approximately by:

$$T_{max} - T_{min} = \frac{1}{2} \frac{\phi_b^2}{\left(\frac{\kappa}{\sigma}\right)} \quad (4.12)$$

assuming that the kinetic Peltier contributions from the wire equivalent regions can be neglected as above.

The ohmic contact is preferably matched to the barrier material so that the barrier which is imposed by design is greater than the barrier mismatch at the ohmic contact. In other embodiments, significant barrier mismatches exist. This, however, results in different cooling powers for the two segments, and leads to temperature gradients within the sample. Ohmic matching is a problem solved in the context of this invention, and its solution is adopted attending to the nature of the work functions, which are temperature-dependent. Preferably, the contact between the wire equivalent section and the barrier section is also an ohmic contact.

In some embodiments, metal legs are used for the "wire equivalent" segments. In this case, the geometry is preferably selected so that the resistance associated with the barrier region is small compared to the resistance of the wire equivalent regions. (This should of course be true even for semiconductor and semimetal implementations of the wire equivalent, however, when a metal is used, the conductivity of the metal can be higher than that of the barrier material by 2–3 orders of magnitude). In this case, the barrier region preferably has a rather small length. Lengths used in some embodiments are about 1 cm for the metal length, and in the range from about 1 micron to about 10 microns for the barrier region length. Significantly longer parameters could be used, but the system efficiency is then envisaged to degrade as iR-heating in the barrier region will dominate the heat flow calculation.

Use of Multiple Barrier Regions

In some embodiments of the present invention, a single barrier provides the necessary barrier height. In other embodiments, a larger total barrier is obtained by building it up with a collection of smaller barriers. In FIG. 4.9, we illustrate a 2-sided scheme in which three barrier regions are implemented on each side.

The operation of this scheme is dependent on the ability of an ohmic contact to "reset" the Fermi level from one side to the other. Experiments on thermionic energy converters carried out in the context of this invention gave improved results for stacked converters. If we postulate that the Fermi level on either side of a thin ohmic contact is made to be approximately equal by virtue of being in proximity to the ohmic contact, then the band edges are made to have an offset which is different on either side. The mechanism for this effect is the development of charge layers which appear at each of the contacts between metal and semiconductor. The end result is that electrons which transport from one side of the contact to the other give rise to essentially no net heating or cooling effect. There will be a small kinetic Peltier contribution due to the difference in Peltier coefficients in the semiconductor regions on the two sides, but this contribution is locally small against contributions from the designed-in barrier.

Within the framework of the simple model discussed in this section, the end-point temperature can be estimated from:

$$T_{max} - T_{min} = \frac{n_b^2}{8} \frac{\phi_b^2}{\left(\frac{K}{\sigma}\right)} \quad (4.13)$$

where $n_b$ is the total number of barriers present. It is assumed that the barrier regions are thin such that the resistive power dissipation in the regions is small compared to that within the wire equivalent regions. It is also assumed that the barriers individually are small so as to not significantly restrict the current flow.

Ganging Together Many Circuits in Series

The optimization of the applied voltage described above for the simple model leads to a relatively low value for the applied voltage. The current densities for these systems can be very high. Overall, they will constitute low impedance devices, in the same sense as their thermoelectric equivalents. Consequently, some embodiments implement two-sided thermal circuits ganged together in series in order to increase the overall impedance. This type of arrangement is illustrated in FIG. 4.10.

Characteristics described herein for constituents such as potential barrier segments, wire equivalent segments, and inverse potential barrier segments, in superconducting and non-superconducting forms, are applicable to embodiments of the present invention that comprise such elements in any number. Accordingly, descriptions provided herein with reference to devices with a plurality of circuits are not limited to such embodiments, but they are also applicable to embodiments with only one circuit.

Embodiments of solid state thermionic refrigerators with a two-sided thermal circuit comprise a finite number N of elements $E_i$, $1 \leq i \leq N$. Each of said elements $E_i$ has at least one potential barrier segment $B_i$ and at least one wire equivalent segment $W_i$ in contact with said at least one potential barrier segment $B_i$. Each the at least one potential barrier segment $B_i$ comprises at least a first solid state region with a first doping level in physical contact with at least a second solid state region with a second doping level. These regions are indicated with numerals 50 and 51 in one of the potential barrier segments shown in FIG. 4.8, and in one of the potential barrier regions shown in FIG. 4.9. Analogous representations are used in other drawings schematically showing embodiments of this invention. These regions establish a potential energy barrier to electric carriers. The at least first solid state region and the at least second solid state region are disposed with respect to each other so that the circulation of a negative electrical charge experiences an increasing potential energy barrier when circulating from one of these at least first solid state region and second solid state region to the other of the at least first solid state region and second solid state region.

Each element $E_j$, $2 \leq j \leq N-1$, has a connectivity with neighboring elements such that the barrier segments and the wire-equivalent segments are arranged as schematically shown in FIG. 4.10 and discussed below.

$W_j$ is in electrical communication through a hot ohmic contact with $W_{j-1}$, with the hot ohmic contact being located between $W_j$ and $W_{j-1}$, but $W_j$ is not in direct electrical communication through an ohmic contact with $W_{j+1}$. For example, wire-equivalent segment $W_2$ in FIG. 4.10 is in electrical communication with wire-equivalent segment $W_1$ through an ohmic contact, which is termed hot ohmic contact. In contrast, wire-equivalent segment $W_2$ in FIG. 4.10 is not in direct electrical communication through an ohmic contact directly connecting it with wire-equivalent segment $W_3$.

It is understood that the subscripts are provided in the description of these embodiments of refrigerators merely as labels. Their counting may run according to any sense, for example from left to right, or from right to left with the appropriate formal changes, without affecting or limiting the substantive characteristics of the embodiments discussed herein.

Potential barrier segment $B_j$ is in electrical communication through a cold ohmic contact with potential barrier segment $B_{j+1}$, with the cold ohmic contact being located between $B_j$ and $B_{j+1}$, but $B_j$ is not in direct electrical communication through an ohmic contact with $B_{j-1}$. For example, potential barrier segment $B_2$ in FIG. 4.10 is in electrical communication with potential barrier segment $B_3$ through an ohmic contact, which is termed cold ohmic contact. In contrast, potential barrier segment $B_2$ in FIG. 4.10 is not in direct electrical communication through an ohmic contact directly connecting it with potential barrier segment $B_1$.

The terms "hot ohmic contact" and "cold ohmic contact" are used as designations for ohmic contacts that are assigned reference numerals 10 and 20, respectively, in FIGS. 4.10, 4.11, and 4.12. Contacts 10 are typically at a higher temperature than contacts 20 when devices according to this invention are effectively at work as refrigerators.

As to the outer-most elements $E_1$ and $E_N$, $W_1$ is in electrical communication through a hot ohmic contact with $W_2$. $B_1$ is configured for an electrical connection with an exterior electrical circuit, which is schematically shown in FIG. 4.10 as an ohmic contact extending to the left that receives electric current intensity I. $B_N$ is in electrical communication through a cold ohmic contact with $B_{N-1}$. $W_N$ is configured for an electrical connection with an exterior electrical circuit, which is schematically indicated in FIG. 4.10 as an ohmic contact extending to the right from the last wire-equivalent segment to the right of the arrangement depicted therein.

As indicated above, barrier segments according to this invention are formed so that a circulating electrically negative particle experiences an increasing potential energy barrier when circulating through at least part of the barrier segment. In addition to the examples provided above, examples of barrier segments include at least one n*n element, a plurality of such elements, at least one n*p junction element, a plurality of such elements, a combination of at least one n*n element and at least one n*p junction element, a combination of at least one n*n element with at least one metal layer; a combination of at least one n*p junction element with at least one metal layer; and a combination of at least one n*n element and at least one n*p junction element with at least one metal layer. For example, the embodiment schematically shown in FIG. 4.9 comprises a plurality of barrier regions, each of each includes an n*n barrier, so that the arrangement of such barriers in the sense of the electric current intensity I shown in FIG. 4.9 with an arrow is n*n, n*n, n*n barrier regions from bottom to top in the barrier segment at the left side of the depicted embodiment, and n*n, n*n, n*n barrier regions from top to bottom in the barrier segment in the right side of the same embodiment schematically shown in FIG. 4.9.

The number N of elements E; can in principle be any desired number, and it ranges from as few as two or three to hundreds or even thousands of them. The embodiment schematically shown in FIG. 4.10 includes nine elements. Other embodiments include a number of elements that range from 3 to 20, whereas other embodiments include from 3 to 50 elements and other embodiments include from 3 to 100 elements.

The total effective barrier which is seen in series in this arrangement with a two-sided thermal circuit is considerable. Other embodiments implement heat pumps in each of the different segments. Regarding barrier effects, barriers on one side produce cooling; complementary matched inverse barriers on the other side produce heating. The heat sink collects the heat produced at these new barriers. The preferable net effect of introducing the complementary barriers is to zero-out incremental barrier effects from one segment to the next as seen by the source. Each leg individually in this scheme preferably acts to collect heat from the cold side, and deposit it at the heat sink; hence each leg individually acts as an independent heat pump. A schematic of this is illustrated in FIG. 4.11.

Embodiments of solid state thermionic refrigerators with inverse barrier comprise a finite number N of elements $E_i$, $1 \leq i \leq N$. Each element $E_i$ has at least one potential barrier segment $B_i$, at least one inverse potential barrier segment $IB_i$, and at least one wire equivalent segment $W_i$ in contact with both the at least one potential barrier segment $B_i$ and the at least one inverse potential barrier segment $IB_i$. Each at least one barrier segment $B_i$ is analogous to the barrier segment described above for the embodiments with a two-sided thermal circuit without inverse barrier segments.

Each at least one inverse potential barrier element $IB_i$ comprises at least a first solid state inverse region with a first doping level in physical contact with at least a second solid state inverse region with a second doping level. These inverse regions are indicated with numerals 52 and 53 in one of the inverse potential barrier elements shown in FIG. 4.11. Analogous representations are used in other drawings schematically showing embodiments of this invention. These first and second regions establish a potential energy barrier to electric carriers. These first and second regions are disposed with respect to each other so that the circulation of a negative electrical charge experiences a decreasing potential energy barrier when circulating from one of the first solid state inverse region and the second solid state inverse region to the other of the first solid state inverse region and the second solid state inverse region.

Each element $E_j$, $2 \leq j \leq N-1$, has a connectivity with neighboring elements such that the potential barrier segments, the wire-equivalent segments and the inverse potential barrier segments are arranged as schematically shown in FIG. 4.11 and discussed below.

$IB_j$ is in electrical communication through a hot ohmic contact with $IB_{j-1}$, wherein the hot ohmic contact is located between $IB_j$ and $IB_{j-1}$. $IB_j$ is not in direct electrical communication through an ohmic contact directly connecting $IB_j$ with $IB_{j+1}$.

$B_j$ is in electrical communication through a cold ohmic contact with $B_{j+1}$, wherein the cold ohmic contact is located between $B_j$ and $B_{j+1}$. $B_j$ is not in direct electrical communication through an ohmic contact directly connecting $B_j$ with $B_{j-1}$. The terms "hot ohmic contact" and "cold ohmic contact" are used herein as they have been introduced in connection with the discussion of embodiments with two-sided thermal circuits with no inverse barrier segments.

As to the outer-most elements $E_1$ and $E_N$, $IB_1$ is in electrical communication through a hot ohmic contact with $IB_2$. $B_1$ is configured for an electrical connection with an exterior electrical circuit that is schematically depicted in FIG. 4.11 as in FIG. 4.10. $B_N$ is in electrical communication through a cold ohmic contact with $B_{N-1}$. $IB_N$ is configured for an electrical connection with an exterior electrical circuit that is schematically depicted in FIG. 4.11 as in FIG. 4.10.

Inverse barrier segments according to this invention are formed analogously as the barrier segments. The relative order of the different electrically conductive materials in the inverse barrier segments, however, is such that a circulating electrically negative particle experiences a decreasing potential energy barrier when circulating through at least part of the inverse barrier segment. This effect can be accomplished, for example, by inverting the relative order of the barrier segment constituents.

As indicated above with respect to the embodiments with two-sided thermal circuits without inverse barrier segments, the number N of elements $E_i$ can in principle be any desired number, and it ranges from as few as two or three to hundreds or even thousands of them. The embodiment schematically shown in FIG. 4.11 includes nine elements, and N for these refrigerators with inverse barrier segments can range within limits at least as broad as those indicated above for the embodiments with no inverse barrier segments.

Each one of the wire-equivalent segments, $W_i$, shown in FIGS. 4.10 and 4.11 has one corresponding terminal end, $T_i$, that is in electrical communication with a barrier at a barrier contact, $BC_i$, and an opposite terminal end. Each one of these opposite terminal ends shown in FIG. 4.11 comprises a corresponding inverse barrier, and none of such opposite terminal ends shown in FIG. 4.10 comprises an inverse barrier. Other embodiments of the present invention are provided with wire-equivalent segments with an inverse barrier at at least one of such opposite ends.

Use of Superconductors

It is envisaged that within the three-element refrigeration design proposed here, the use of a superconductor for the wire equivalent provides for a nearly ideal system. The principal advantage of the superconductor is that it can conduct current with no dissipation. Superconductors tend to be poor thermal conductors, so that a significant thermal gradient is expected to be sustained across a long superconducting wire. Most importantly relative to the present discussion is that the ratio:

$$\frac{\kappa}{\sigma} \to \infty \qquad (4.14)$$

in the case of a superconductor.

High-$T_c$ superconductors have been demonstrated up to about 150 K at this point, and they are envisaged as being well within range of the three-element cooling scheme as a single stage refrigeration system. A superconducting embodiment of this invention with a maximum temperature below the critical temperature provides two-stage for continuous solid state cooling down to liquid helium temperature.

We note that there has been a recent report of a room temperature superconductor with a critical temperature of 340 K. If this can be made to be reproducible, reliable and available for applications, then near perfect cooling systems are envisaged in the context of this invention and these embodiments are expected to operate at essentially the Carnot limit at essentially all temperatures below the critical temperature, which in this case includes room temperature.

Geometric Scheme Using Superconducting Segments

This example takes advantage of high $T_c$ superconductors. Geometric stacks are sometimes used to make thermoelectric coolers that can reach very low temperatures. In this arrangement, one stack provides cooling at a much lower temperature than the heat sink. A second stack can be implemented which uses the lower layer of cooling units as a heat sink, which reach a lower temperature. Thermoelectric coolers with up to about 6 layered regions were built and tested.

In this aspect of the present invention, the greater relative cooling power of the thermionic coolers described above is used to reach a low temperature below the critical temperature of a high $T_c$ superconductor. In this case, the second stack above uses a superconducting implementation as discussed above to obtain near Carnot-limited cooling down to extremely low temperatures. Cooling using superconductors is expected to approach the Carnot limit for cooling below the critical temperature. A preferred barrier in this case is of an alloy-type material, such as is used in quantum well technology. For example, HgSe and HgSe:Fe layers are embodiments of such barrier material. An example of such a scheme is indicated in FIG. 4.12.

An embodiment of a solid state superconducting thermionic refrigerator according to the present invention comprises at least one tier with a finite number N of elements $E_i$, $1 \leq i \leq N$, and at least one tier comprising a finite number M of superconducting elements $SE_j$, $1 \leq j \leq M$. Each of said elements $E_i$ has at least one barrier segment $B_i$, and at least one wire equivalent segment $W_i$ in contact with the at least one potential barrier segment $B_i$ at a barrier contact $BC_i$.

Each of the wire-equivalent segments $W_i$ has a terminal end $T_i$ opposite to the barrier contact $BC_i$; each of the at least one potential barrier segments $B_i$ comprises at least a first solid state region with a first doping level in physical contact with at least a second solid state region with a second doping level.

The at least first solid state region and the at least second solid state region establish a potential energy barrier to electric carriers, and the at least first solid state region and the at least second solid state region are disposed with respect to each other so that the circulation of a negative electrical charge experiences an increasing potential energy barrier when circulating from one of the at least first solid state region and the second solid state region to the other of the at least first solid state region and the second solid state region.

Each of the elements $E_i$, $2 \leq i' \leq N-1$, has a connectivity with neighboring elements such that terminal end $T_{i'}$ is in electrical communication through a hot ohmic contact with terminal end $T_{i'-1}$, wherein the hot ohmic contact is located between $T_{i'}$ and $T_{i'-1}$, but $T_{i'}$ is not in direct electrical communication through an ohmic contact directly connecting $T_{i'}$ with $T_{i'+1}$. Potential barrier segment $B_{i'+1}$, is in electrical communication through a cold ohmic contact with potential barrier segment $B_{i'+1}$, wherein the cold ohmic contact is located between $B_{i'}$ and $B_{i'+1}$, but $B_{i'}$ is not in direct electrical communication through an ohmic contact directly connecting $B_{i'}$ with $B_{i'-1}$. Terminal end $T_1$ is in electrical communication through a hot ohmic contact with terminal end $T_2$. Potential barrier segment $B_1$ is configured for an electrical connection with an exterior electrical circuit; potential barrier segment $B_N$ is in electrical communication through a cold ohmic contact with $B_{N-1}$; and terminal end $T_N$ is configured for an electrical connection with an exterior electrical circuit.

Each of the superconducting elements $SE_j$ has at least one barrier segment $SB_j$, and at least one superconducting wire equivalent segment $SW_j$ in contact with the at least one barrier segment $SB_j$ at a superconducting barrier contact $SBC_j$. Each of the at least one barrier segments $SB_j$ comprises at least a first solid state region with a first doping level in physical contact with at least a second solid state region with a second doping level.

Each of the superconducting wire equivalent segments $SW_j$ has a superconducting terminal end $ST_j$ opposite to the superconducting barrier contact $SBC_j$, and the at least first solid state region and the at least second solid state region establish a potential energy barrier to electric carriers.

The at least first solid state region and the at least second solid state region are disposed with respect to each other so that the circulation of a negative electrical charge experiences an increasing potential energy barrier when circulating from one of the at least first solid state region and the second solid state region to the other of the at least first solid state region and the second solid state region.

Each superconducting element $SE_{j'}$, $2 \leq j' \leq M-1$, has a connectivity with neighboring elements such that superconducting terminal end $ST_{j'}$ is in electrical communication through a superconducting element hot ohmic contact with superconducting terminal end $ST_{j'-1}$, wherein said superconducting element hot ohmic contact is located between $ST_{j'}$ and $ST_{j'-1}$, but $ST_{j'}$ is not in direct electrical communication through an ohmic contact directly connecting $ST_{j'}$ with $ST_{j'+1}$.

Potential barrier segment $SB_{j'}$ is in electrical communication through a superconducting element cold ohmic contact with $SB_{j'+1}$, wherein the superconducting element cold ohmic contact is located between $SB_{j'}$ and $SB_{j'+1}$, but $SB_{j'}$ is not in direct electrical communication through an ohmic contact directly connecting $SB_{j'}$ with $SB_{j'-1}$.

Superconducting terminal end $ST_1$ is in electrical communication through a superconducting element hot ohmic contact with $ST_2$, and potential barrier segment $SB_1$ is configured for an electrical connection with an exterior electrical circuit. Potential barrier segment $SB_M$ is in electrical communication through a superconducting element cold ohmic contact with $SB_{M-1}$, and superconducting terminal end $ST_M$ is configured for an electrical connection with an exterior electrical circuit.

As shown in FIG. 4.12, the superconducting element hot ohmic contacts are separated from the cold ohmic contacts by a separator 90 that is in contact with the superconducting element hot ohmic contacts and with the cold ohmic contacts. This separator preferably comprises a material that is a thermal conductor and an electrical insulator. Examples of such material are aluminum nitride and aluminum nitride containing materials.

Although the embodiment schematically depicted in FIG. 1.12 shows wire-equivalent segments with an inverse potential barrier segment IB at each barrier contacts BC, and superconducting wire-equivalent segments with an inverse potential barrier segment SIB at each superconducting barrier contact SBC, other embodiments of this invention do not have inverse potential barriers IB, and other embodiments of this invention do not have inverse potential barriers SIB. Still other embodiments of this invention have at least one inverse potential barrier IB, but not all the wire-equivalent segments have such inverse potential barrier IB, and other embodiments of this invention have at least one inverse potential barrier SIB, but not all the superconducting wire-equivalent segments have such inverse potential barrier SIB.

Embodiments according to the present invention typically have superconducting elements $SE_1$ and $SE_2$ in electrical communication with each other through an ohmic contact. When there are more than two such superconducting elements, superconducting elements $SE_{M-1}$ and $SE_M$ are in electrical communication with each other through an ohmic contact. The outer superconducting elements SE, and $SE_M$, or $SE_1$ and $SE_2$, if there are only two such elements, are configured for electrical communication with an exterior electrical circuit.

Note that the elements in embodiments according to the present invention, whether superconducting SE elements or non-superconducting E elements, are not restricted as to the type of contact with an exterior electrical circuit, and any one of the two ends of such elements can be configured for such contact. For example, a contact with an exterior circuit can be established with any one of the following components of a given element, superconducting or not: barrier, inverse barrier, and wire-equivalent end that has not barrier and has no inverse barrier.

The term superconducting element, SE, is herein employed to refer to an element with at least one superconducting component. Whether superconducting itself or not, any component of a superconducting element is for notation purposes denoted herein with a first capital S letter, for example, SB for a barrier in a superconducting element SE, SIB for an inverse barrier in a superconducting element SE.

Discussion

The three-element design for refrigeration according to this invention separates the cooling functionality from the thermal insulation functionality. Conventional thermoelectric refrigerator designs do not allow for the separation of this functionality, and are therefore limited by basic physical properties of the materials. In the designs proposed here, the cooling is determined by the presence of one or more potential barriers. The thermal insulation is accomplished by using thermodynamically efficient materials. This combination has advantageous refrigeration capabilities. Embodiments according to this invention are capable of exceeding the performance of existing thermoelectric coolers.

Models and approximations developed hereinabove are provided to highlight relevant variables and thus enable the ordinary skill in the art to supplement the embodiments described above with additional embodiments that are within the scope of this invention. In addition, design parameters can thus be rapidly evaluated over a wide range of parameter space.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A solid state thermionic refrigerator, comprising:
   at least one potential barrier segment;
   a first wire-equivalent segment in electrical communication with said at least one potential barrier segment; and
   a second wire-equivalent segment in electrical communication with said at least one potential barrier segment;
   wherein:
   said at least one potential barrier segment comprises at least a first solid state region with a first doping level in physical contact with at least a second solid state region with a second doping level;
   said at least first solid state region and said at least second solid state region establish a potential energy barrier to electric carriers; and
   said at least first solid state region and said at least second solid state region are disposed with respect to each other so that the circulation of a negative electrical charge experiences an increasing potential energy barrier when circulating from one of said at least first solid state region and said second solid state region to the other of said at least first solid state region and said second solid state region.

2. A solid state thermionic refrigerator as in claim 1, wherein said at least one potential barrier segment comprises a material that provides a barrier height of about 100 meV at room temperature.

3. A solid state thermionic refrigerator as in claim 1, wherein said at least one potential barrier segment comprises a material that provides a barrier height from about 100 meV to about 200 meV.

4. A solid state thermionic refrigerator as in claim 1, wherein said at least one potential barrier segment comprises at least one of a Shottky barrier, a semiconductor heterojunction barrier, a resonant tunneling barrier, a fractional contact barrier, and a variable doping barrier.

5. A solid state thermionic refrigerator as in claim 1, wherein said at least one potential barrier segment comprises a cermet.

6. A solid state thermionic refrigerator as in claim 1, wherein said at least one potential barrier segment comprises at least one of a dielectric barrier and a vacuum barrier.

7. A solid state thermionic refrigerator as in claim 1, wherein said at least one potential barrier segment comprises HgSe.

8. A solid state thermionic refrigerator as in claim 1, wherein said at least one potential barrier segment comprises HgSe:Fe quantum wells.

9. A solid state thermionic refrigerator as in claim 1, wherein said at least one potential barrier segment comprises an alloy-type material.

10. A solid state thermionic refrigerator as in claim 1, wherein said at least one potential barrier segment comprises in n*n barrier.

11. A solid state thermionic refrigerator as in claim 1, wherein said at least one potential barrier segment comprises an n*p junction.

12. A solid state thermionic refrigerator as in claim 1, wherein said at least one potential barrier segment is characterized by an energy barrier height in the range from about $2 k_B T$ to about $7 k_B T$, where $k_B$ is the Boltzman constant and T is the potential barrier segment temperature.

13. A solid state thermionic refrigerator as in claim 1, wherein said at least one potential barrier segment is characterized by an energy barrier height in the range from about $4 k_B T$ to about $5 k_B T$, where $k_B$ is the Boltzman constant and T is the potential barrier segment temperature.

14. A solid state thermionic refrigerator as in claim 1, wherein said at least one potential barrier segment comprises a material for which the energy barrier height increases as the temperature increases.

15. A solid state thermionic refrigerator as in claim 1, wherein said at least one potential barrier segment comprises a plurality of n*n barriers.

16. A solid state thermionic refrigerator as in claim 1, wherein said at least one potential barrier segment comprises at least one n*n barriers and at least one n*p junction.

17. A solid state thermionic refrigerator as in claim 1, wherein at least one of said first wire-equivalent and said second wire-equivalent segments comprises n-type doped InSb.

18. A solid state thermionic refrigerator as in claim 1, wherein at least one of said first wire-equivalent and said second wire-equivalent segments comprises mercury cadmium telluride, $Hg_{1-x}Cd_xTe$, where x is within the range from about 0.14 to about 0.2.

19. A solid state thermionic refrigerator as in claim 1, wherein at least one of said first wire-equivalent and said second wire-equivalent segments comprises mercury cadmium telluride, $Hg_{1-x}Cd_xTe$, where x is within the range from about 0.14 to about 0.2, with n-type dopant at a concentration of about $10^{17}$ cm$^{-3}$.

20. A solid state thermionic refrigerator as in claim 1, wherein at least one of said first wire-equivalent and said second wire-equivalent segments comprises bismuth, Bi.

21. A solid state thermionic refrigerator as in claim 1, wherein at least one of said first wire-equivalent and said second wire-equivalent segments comprises bismuth, Bi, with n-type dopant at a concentration in the range from about $10^{17}$ cm$^{-3}$ to about $2.5 \times 10^{19}$ cm$^{-3}$.

22. A solid state thermionic refrigerator as in claim 1, wherein at least one of said first wire-equivalent and said second wire-equivalent segments comprises a superconductor.

23. A solid state thermionic refrigerator as in claim 1, wherein at least one of said first wire-equivalent and said second wire-equivalent segments comprises a high $T_c$ superconductor.

24. A solid state thermionic refrigerator as in claim 1, wherein said first wire-equivalent segment and said second wire-equivalent segment comprise the same material.

25. A solid state thermionic refrigerator as in claim 1, wherein at least one of said first wire-equivalent and said second wire-equivalent segments comprises at least one of a metal, semimetal, electric conductor, and semiconductor.

26. A solid state thermionic refrigerator as in claim 1, wherein said first wire-equivalent segment has a first length, $l_1$, said second wire-equivalent segment has a second length, $l_2$, and wherein said at least one potential barrier segment contacts said first wire-equivalent segment at a first potential barrier segment side, said at least one potential barrier segment contacts said second wire-equivalent segment at a second potential barrier segment side, said first potential barrier segment side and said second potential barrier segment side are separated by a barrier length, and said barrier length is not greater than $10^{-3} l_1$ and not greater than $10^{-3} l_2$.

27. A solid state thermionic refrigerator as in claim 1, wherein said at least one potential barrier segment comprises a first potential barrier segment and a second potential barrier segment, and said first potential barrier segment is electrically connected to said second potential barrier segment by an ohmic contact.

28. A solid state thermionic refrigerator as in claim 1, wherein said at least one potential barrier segment comprises a first potential barrier segment and a second potential barrier segment, said first potential barrier segment is electrically connected to said second potential barrier segment by an ohmic contact, said first wire equivalent segment is configured for an electric connection with an exterior circuit, and said second wire equivalent segment is configured for another electrical connection with an exterior circuit.

29. A solid state thermionic refrigerator as in claim 27, wherein at least one of said first potential barrier segment and said second potential barrier segment comprise a plurality of potential barrier regions;

each one of said plurality of potential barrier regions comprises at least a first solid state barrier region with a first doping level in physical contact with at least a second solid state potential barrier region with a second doping level;

said at least first solid state potential barrier region and said at least second solid state potential barrier region establish a potential energy barrier to electric carriers; and said at least first solid state potential barrier region and said at least second solid state potential barrier region are disposed with respect to each other so that the circulation of a negative electrical charge experiences an increasing potential energy barrier when circulating from one of said at least first solid state potential barrier region and said second solid state potential barrier region to the other of said at least first solid state potential barrier region and said second solid state potential barrier region.

30. A solid state thermionic refrigerator as in claim 28, wherein at least one of said first potential barrier segment and said second potential barrier segment comprises a plurality of barrier regions; wherein:

each one of said plurality of potential barrier regions comprises at least a first solid state potential barrier region with a first doping level in physical contact with at least a second solid state potential barrier region with a second doping level;

said at least first solid state potential barrier region and said at least second solid state potential barrier region establish a potential energy barrier to electric carriers; and said at least first solid state potential barrier region and said at least second solid state potential barrier region are disposed with respect to each other so that the circulation of a negative electrical charge experiences an increasing potential energy barrier when circulating from one of said at least first solid state potential barrier region and said second solid state potential barrier region to the other of said at least first solid state potential barrier region and said second solid state potential barrier region.

31. A solid state thermionic refrigerator as in claim 1, wherein said at least one potential barrier segment comprises a first barrier segment and a second potential barrier segment;

said first wire equivalent segment is electrically connected to a first inverse potential barrier segment, said second wire-equivalent segment is electrically connected to a second inverse potential barrier segment, wherein said inverse potential barrier segment comprises at least a first solid state inverse barrier region and a second solid state inverse barrier region disposed with respect to each other so that the circulation of a negative electrical charge experiences a decreasing potential energy barrier when circulating from one of said at least first solid state inverse barrier region and said second solid state inverse barrier region to the other of said at least first solid state inverse barrier region and said second solid state inverse barrier region;

said first inverse potential barrier segment and said second inverse potential barrier segment are in electrical communication through an ohmic contact;

said first potential barrier segment is configured for an electric connection with an exterior circuit; and said second potential barrier segment is configured for another electrical connection with an exterior electrical circuit.

32. A solid state thermionic refrigerator as in claim 31, wherein at least one of said first potential barrier segment and said second potential barrier segment comprises a plurality of potential barrier regions;

each one of said plurality of potential barrier regions comprises at least a first solid state barrier region with a first doping level in physical contact with at least a second solid state barrier region with a second doping level;

said at least first solid state barrier region and said at least second solid state barrier region establish a potential energy barrier to electric carriers; and said at least first solid state barrier region and said at least second solid state barrier region are disposed with respect to each other so that the circulation of a negative electrical charge experiences an increasing potential energy barrier when circulating from one of said at least first solid state barrier region and said second solid state barrier region to the other of said at least first solid state barrier region and said second solid state barrier region.

33. A solid state thermionic refrigerator as in claim 31, wherein at least one of said first inverse potential barrier segment and said second inverse potential barrier segment comprises a plurality of inverse barrier regions;

each one of said plurality of inverse barrier regions comprises at least a first solid state inverse barrier region with a first doping level in physical contact with at least a second solid state inverse barrier region with a second doping level;

said at least first solid state inverse barrier region and said at least second solid state inverse barrier region establish a potential energy barrier to electric carriers; and said at least first solid state inverse barrier region and said at least second solid state inverse barrier region are disposed with respect to each other so that the circulation of a negative electrical charge experiences a decreasing potential energy barrier when circulating from one of said at least first solid state inverse barrier region and said second solid state inverse barrier region to the other of said at least first solid state inverse barrier region and said second solid state inverse barrier region.

34. A solid state thermionic refrigerator with a two-sided thermal circuit, comprising:

finite number N of elements $E_i$, $1 \leq i \leq N$, each of said elements $E_i$ having:

at least one potential barrier segment $B_i$, and at least one wire equivalent segment $W_i$ in contact with said at least one potential barrier segment $B_i$ at a barrier contact $BC_i$, wherein:

each of said wire-equivalent segment $W_i$ has a terminal end $T_i$ opposite to said barrier contact $BC_i$;

each said at least one potential barrier segment $B_i$ comprises at least a first solid state region with a first doping level in physical contact with at least a second solid state region with a second doping level;

said at least first solid state region and said at least second solid state region establish a potential energy barrier to electric carriers;

said at least first solid state region and said at least second solid state region are disposed with respect to each other so that the circulation of a negative electrical charge experiences an increasing potential energy barrier when circulating from one of said at least first solid state region and said second solid state region to the other of said at least first solid state region and said second solid state region;

each said element $E_j$, $2 \leq j \leq N-1$, has a connectivity with neighboring elements such that:

terminal end $T_j$ is in electrical communication through a hot ohmic contact with terminal end $T_{j-1}$, wherein said hot ohmic contact is located between $T_j$ and $T_{j-1}$, but $T_j$ is not in direct electrical communication through an ohmic contact directly connecting $T_j$ with $T_{j+1}$;

potential barrier segment $B_j$ is in electrical communication through a cold ohmic contact with potential barrier segment $B_{j+1}$, wherein said cold ohmic contact is located between $B_j$ and $B_{j+1}$, but $B_j$ is not in direct electrical communication through an ohmic contact directly connecting $B_j$ with $B_{j-1}$;

elements $E_1$ and $E_2$ are in electrical communication with each other through an ohmic contact; elements $E_{N-1}$ and $E_N$ are in electrical communication with each other through an ohmic contact; and elements $E_1$ and $E_N$ are configured for electrical communication with an exterior electrical circuit.

35. A solid state thermionic refrigerator as in claim 34, wherein N=9.

36. A solid state thermionic refrigerator as in claim 34, wherein N is in the range from 3 to 100.

37. A solid state thermionic refrigerator as in claim 34, wherein N is in the range from 3 to 50.

38. A solid state thermionic refrigerator as in claim 34, wherein N is in the range from 3 to 20.

39. A solid state thermionic refrigerator as in claim 34, wherein each one of said terminal ends $T_i$, $1 \leq i \leq N$, is an end of each corresponding wire-equivalent segment $W_i$.

40. A solid state thermionic refrigerator as in claim 34, wherein at least one of said terminal ends $T_i$, $1 \leq i \leq N$, comprises an inverse potential barrier segment $IB_i$ such that each said at least one inverse potential barrier segment $IB_i$ comprises:
   at least a first solid state inverse region with a first doping level in physical contact with at least a second solid state inverse region with a second doping level, wherein
   said at least first solid state inverse region and said at least second solid state inverse region establish a potential energy barrier to electric carriers, and
   said at least first solid state inverse region and said at least second solid state inverse region are disposed with respect to each other so that the circulation of a negative electrical charge experiences a decreasing potential energy barrier when circulating from one of said at least first solid state inverse region and said second solid state inverse region to the other of said at least first solid state inverse region and said second solid state inverse region.

41. A solid state thermionic refrigerator as in claim 34, wherein each one of said terminal ends $T_i$, $1 \leq i \leq N$, comprises an inverse potential barrier segment $IB_i$ such that each said at least one inverse potential barrier segment $IB_i$ comprises:
   at least a first solid state inverse region with a first doping level in physical contact with at least a second solid state inverse region with a second doping level, wherein
   said at least first solid state inverse region and said at least second solid state inverse region establish a potential energy barrier to electric carriers, and
   said at least first solid state inverse region and said at least second solid state inverse region are disposed with respect to each other so that the circulation of a negative electrical charge experiences a decreasing potential energy barrier when circulating from one of said at least first solid state inverse region and said second solid state inverse region to the other of said at least first solid state inverse region and said second solid state inverse region.

42. A solid state superconducting thermionic refrigerator, comprising:
   at least one first tier comprising a finite number N of elements $E_i$, $1 \leq i \leq N$; and
   at least one second tier comprising a finite number M of superconducting elements $SE_j$, $1 \leq j \leq M$; wherein
   each of said elements $E_i$ has:
      at least one potential barrier segment $B_i$, and
      at least one wire equivalent segment $W_i$ in contact with said at least one potential barrier segment $B_i$ at a barrier contact $BC_i$, wherein:
   each of said wire-equivalent segment $W_i$ has a terminal end $T_i$ opposite to said barrier contact $BC_i$;
   each said at least one potential barrier segment $B_i$ comprises at least a first solid state region with a first doping level in physical contact with at least a second solid state region with a second doping level;
   said at least first solid state region and said at least second solid state region establish a potential energy barrier to electric carriers;
   said at least first solid state region and said at least second solid state region are disposed with respect to each other so that the circulation of a negative electrical charge experiences an increasing potential energy barrier when circulating from one of said at least first solid state region and said second solid state region to the other of said at least first solid state region and said second solid state region;
   each said element $E_{i'}$, $2 \leq i' \leq N-1$, has a connectivity with neighboring elements such that:
      terminal end $T_{i'}$ is in electrical communication through a hot ohmic contact with terminal end $T_{i'-1}$, wherein said hot ohmic contact is located between $T_{i'}$ and $T_{i'-1}$, but $T_{i'}$ is not in direct electrical communication through an ohmic contact directly connecting $T_{i'}$ with $T_{i'+1}$;
      potential barrier segment $B_{i'}$ is in electrical communication through a cold ohmic contact with potential barrier segment $B_{i'+1}$, wherein said cold ohmic contact is located between $B_{i'}$ and $B_{i'+1}$, but $B_{i'}$ is not in direct electrical communication through an ohmic contact directly connecting $B_{i'}$ with $B_{i'-1}$;
      elements $E_1$ and $E_2$ are in electrical communication with each other through an ohmic contact; elements $E_{N-1}$ and $E_N$ are in electrical communication with each other through an ohmic contact; and elements $E_1$ and $E_N$ are configured for electrical communication with an exterior electrical circuit; and
   each of said superconducting elements $SE_j$ has:
      at least one potential barrier segment $SB_j$, and
      at least one superconducting wire equivalent segment $SW_j$ in contact with said at least one potential barrier segment $SB_j$ at a superconducting barrier contact $SBC_j$, wherein:
   each said at least one potential barrier segment $SB_j$ comprises at least a first solid state region with a first doping level in physical contact with at least a second solid state region with a second doping level;
   each of said superconducting wire equivalent segment $SW_j$ has a superconducting terminal end $ST_j$ opposite to said superconducting barrier contact $SBC_j$;
   said at least first solid state region and said at least second solid state region establish a potential energy barrier to electric carriers;
   said at least first solid state region and said at least second solid state region are disposed with respect to each other so that the circulation of a negative electrical charge experiences an increasing potential energy barrier when circulating from one of said at least first solid state region and said second solid state region to the other of said at least first solid state region and said second solid state region;
   each said superconducting element $SE_{j'}$, $2 \leq j' \leq M-1$, has a connectivity with neighboring elements such that:

superconducting terminal end $ST_{j'}$ is in electrical communication through a superconducting element hot ohmic contact with superconducting terminal end $ST_{j'-1}$, wherein said superconducting element hot ohmic contact is located between $ST_{j'}$ and $ST_{j'-1}$, but $ST_{j'}$ is not in direct electrical communication through an ohmic contact directly connecting $ST_{j'}$ with $ST_{j'+1}$;

potential barrier segment $SB_{j'}$ is in electrical communication through a superconducting element cold ohmic contact with $SB_{j'+1}$, wherein said superconducting element cold ohmic contact is located between $SB_{j'}$ and $SB_{j'+1}$, but $SB_{j'}$ is not in direct electrical communication through an ohmic contact directly connecting $SB_{j'}$ with $SB_{j'-1}$;

superconducting elements $SE_1$ and $SE_2$ are in electrical communication with each other through an ohmic contact; superconducting elements $SE_{N-1}$ and $SE_N$ are in electrical communication with each other through an ohmic contact; and superconducting elements $SE_1$ and $SE_N$ are configured for electrical communication with an exterior electrical circuit; and said superconducting element hot ohmic contacts are separated from said cold ohmic contacts by a separator that is in contact with said superconducting element hot ohmic contacts and with said cold ohmic contacts.

43. A solid state superconducting thermionic refrigerator as in claim 42, wherein each one of said terminal ends $T_i$, $1 \leq i \leq N$, is an end of each corresponding wire-equivalent segment $W_i$.

44. A solid state superconducting thermionic refrigerator as in claim 42, wherein N=9.

45. A solid state superconducting thermionic refrigerator as in claim 42, wherein N is in the range from 3 to 100.

46. A solid state superconducting thermionic refrigerator as in claim 42, wherein each one of said superconducting terminal ends $ST_j$, $1 \leq j \leq M$, is an end of each corresponding superconducting wire-equivalent segment $SW_j$.

47. A solid state superconducting thermionic refrigerator as in claim 42, wherein M=6.

48. A solid state superconducting thermionic refrigerator as in claim 42, wherein M is in the range from 3 to 100.

49. A solid state superconducting thermionic refrigerator as in claim 42, wherein said separator comprises a material that is a thermal conductor and an electrical insulator.

50. A solid state superconducting thermionic refrigerator as in claim 42, wherein said separator comprises aluminum nitride.

51. A solid state superconducting thermionic refrigerator as in claim 42, wherein at least one of said superconducting terminal ends $ST_j$, $1 \leq j \leq M$, comprises an inverse potential barrier segment $SIB_j$ such that each said at least one inverse potential barrier segment $SIB_j$ comprises:

at least a first solid state inverse region with a first doping level in physical contact with at least a second solid state inverse region with a second doping level, wherein said at least first solid state inverse region and said at least second solid state inverse region establish a potential energy barrier to electric carriers, and said at least first solid state inverse region and said at least second solid state inverse region are disposed with respect to each other so that the circulation of a negative electrical charge experiences a decreasing potential energy barrier when circulating from one of said at least first solid state inverse region and said second solid state inverse region to the other of said at least first solid state inverse region and said second solid state inverse region.

52. A solid state superconducting thermionic refrigerator as in claim 42, wherein each one of said superconducting terminal ends $ST_j$, $1 \leq j \leq M$, comprises an inverse potential barrier segment $SIB_j$ such that each said at least one inverse potential barrier segment $SIB_j$ comprises:

at least a first solid state inverse region with a first doping level in physical contact with at least a second solid state inverse region with a second doping level, wherein said at least first solid state inverse region and said at least second solid state inverse region establish a potential energy barrier to electric carriers, and said at least first solid state inverse region and said at least second solid state inverse region are disposed with respect to each other so that the circulation of a negative electrical charge experiences a decreasing potential energy barrier when circulating from one of said at least first solid state inverse region and said second solid state inverse region to the other of said at least first solid state inverse region and said second solid state inverse region.

53. A solid state superconducting thermionic refrigerator as in claim 42, wherein at least one of said terminal ends $T_i$, $1 \leq i \leq N$, comprises an inverse potential barrier segment $IB_i$ such that each said at least one inverse potential barrier segment $IB_i$ comprises:

at least a first solid state inverse region with a first doping level in physical contact with at least a second solid state inverse region with a second doping level, wherein said at least first solid state inverse region and said at least second solid state inverse region establish a potential energy barrier to electric carriers, and said at least first solid state inverse region and said at least second solid state inverse region are disposed with respect to each other so that the circulation of a negative electrical charge experiences a decreasing potential energy barrier when circulating from one of said at least first solid state inverse region and said second solid state inverse region to the other of said at least first solid state inverse region and said second solid state inverse region.

54. A solid state superconducting thermionic refrigerator as in claim 42, wherein each one of said terminal ends $T_i$, $1 \leq i \leq N$, comprises an inverse potential barrier segment $IB_i$ such that each said at least one inverse potential barrier segment $IB_i$ comprises:

at least a first solid state inverse region with a first doping level in physical contact with at least a second solid state inverse region with a second doping level, wherein said at least first solid state inverse region and said at least second solid state inverse region establish a potential energy barrier to electric carriers, and said at least first solid state inverse region and said at least second solid state inverse region are disposed with respect to each other so that the circulation of a negative electrical charge experiences a decreasing potential energy barrier when circulating from one of said at least first solid state inverse region and said second solid state inverse region to the other of said at least first solid state inverse region and said second solid state inverse region.

55. A solid state superconducting thermionic refrigerator, comprising:

at least one first tier comprising a finite number N of elements $E_i$, $1 \leq i \leq N$; and at least one second tier comprising a finite number M of superconducting elements $SE_j$, $1 \leq j \leq M$; wherein each of said elements $E_i$ has:

at least one potential barrier segment $B_i$, and at least one wire equivalent segment $W_i$ in contact with said at least one barrier segment $B_i$ at a barrier contact $BC_i$, wherein:

each of said wire-equivalent segment $W_i$ has a terminal end $T_i$ opposite to said barrier contact $BC_i$;

each said at least one potential barrier segment $B_i$ comprises at least a first solid state region with a first doping level in physical contact with at least a second solid state region with a second doping level;

said at least first solid state region and said at least second solid state region establish a potential energy barrier to electric carriers;

said at least first solid state region and said at least second solid state region are disposed with respect to each other so that the circulation of a negative electrical charge experiences an increasing potential energy barrier when circulating from one of said at least first solid state region and said second solid state region to the other of said at least first solid state region and said second solid state region;

wherein N=2, and $E_1$ and $E_2$ are in electrical communication with each other through an ohmic contact and $E_1$ and $E_2$ are configured for electrical connection with an exterior electrical circuit; and each of said superconducting elements $SE_j$ has:

at least one potential barrier segment $SB_j$, and at least one superconducting wire equivalent segment $SW_j$ in contact with said at least one potential barrier segment $SB_j$ at a superconducting barrier contact $SBC_j$, wherein:

each said at least one potential barrier segment $SB_j$ comprises at least a first solid state region with a first doping level in physical contact with at least a second solid state region with a second doping level;

each of said superconducting wire equivalent segment $SW_j$ has a superconducting terminal end $ST_j$ opposite to said superconducting barrier contact $SBC_j$;

said at least first solid state region and said at least second solid state region establish a potential energy barrier to electric carriers;

said at least first solid state region and said at least second solid state region are disposed with respect to each other so that the circulation of a negative electrical charge experiences an increasing potential energy barrier when circulating from one of said at least first solid state region and said second solid state region to the other of said at least first solid state region and said second solid state region;

each said superconducting element $SE_{j'}$, $2 \leq j' \leq M-1$, has a connectivity with neighboring elements such that:

superconducting terminal end $ST_{j'}$ is in electrical communication through a superconducting element hot ohmic contact with superconducting terminal end $ST_{j'-1}$, wherein said superconducting element hot ohmic contact is located between $ST_{j'}$ and $ST_{j'-1}$, but $ST_{j'}$ is not in direct electrical communication through an ohmic contact directly connecting $ST_{j'}$ with $ST_{j'+1}$;

potential barrier segment $SB_{j'}$ is in electrical communication through a superconducting element cold ohmic contact with $SB_{j'+1}$, wherein said superconducting element cold ohmic contact is located between $SB_{j'}$ and $SB_{j'+1}$, but $SB_{j'}$ is not in direct electrical communication through an ohmic contact directly connecting $SB_{j'}$ with $SB_{j'-1}$;

superconducting elements $SE_1$ and $SE_2$ are in electrical communication with each other through an ohmic contact; superconducting elements $SE_{M-1}$ and $SE_M$ are in electrical communication with each other through an ohmic contact; and superconducting elements $SE_1$ and $SE_M$ are configured for electrical communication with an exterior electrical circuit; and said superconducting element hot ohmic contacts are separated from said cold ohmic contacts by a separator that is in contact with said superconducting element hot ohmic contacts and with said cold ohmic contacts.

56. A solid state superconducting thermionic refrigerator, comprising:

at least one first tier comprising a finite number N of elements $E_i$, $1 \leq i \leq N$; and at least one second tier comprising a finite number M of superconducting elements $SE_j$, $1 \leq j \leq M$; wherein each of said elements $E_i$ has:

at least one potential barrier segment $B_i$, and at least one wire equivalent segment $W_i$ in contact with said at least one potential barrier segment $B_i$ at a barrier contact $BC_i$, wherein:

each of said wire-equivalent segment $W_i$ has a terminal end $T_i$ opposite to said barrier contact $BC_i$;

each said at least one potential barrier segment $B_i$ comprises at least a first solid state region with a first doping level in physical contact with at least a second solid state region with a second doping level;

said at least first solid state region and said at least second solid state region establish a potential energy barrier to electric carriers;

said at least first solid state region and said at least second solid state region are disposed with respect to each other so that the circulation of a negative electrical charge experiences an increasing potential energy barrier when circulating from one of said at least first solid state region and said second solid state region to the other of said at least first solid state region and said second solid state region;

each said element $E_{i'}$, $2 \leq i' \leq N-1$, has a connectivity with neighboring elements such that:

terminal end $T_{i'}$ is in electrical communication through a hot ohmic contact with terminal end $T_{i'-1}$, wherein said hot ohmic contact is located between $T_{i'}$ and $T_{i'-1}$, but $T_{i'}$ is not in direct electrical communication through an ohmic contact directly connecting $T_{i'}$ with $T_{i'+1}$;

potential barrier segment $B_{i'}$ is in electrical communication through a cold ohmic contact with potential barrier segment $B_{i'+1}$, wherein said cold ohmic contact is located between $B_{i'}$ and $B_{i'+1}$, but $B_{i'}$ is not in direct electrical communication through an ohmic contact directly connecting $B_{i'}$ with $B_{i'-1}$;

elements $E_1$ and $E_2$ are in electrical communication with each other through an ohmic contact; elements $E_{N-1}$ and $E_N$ are in electrical communication with each other through an ohmic contact; and elements $E_1$ and $E_N$ are configured for electrical communication with an exterior electrical circuit; and each of said superconducting elements $SE_j$ has:
at least one potential barrier segment $SB_j$, and
at least one superconducting wire equivalent segment $SW_j$ in contact with said at least one potential barrier segment $SB_j$ at a superconducting barrier contact $SBC_j$, wherein:
each said at least one potential barrier segment $SB_j$ comprises at least a first solid state region with a first doping level in physical contact with at least a second solid state region with a second doping level;
each of said superconducting wire equivalent segment $SW_j$ has a superconducting terminal end $ST_j$ opposite to said superconducting barrier contact $SBC_j$;
said at least first solid state region and said at least second solid state region establish a potential energy barrier to electric carriers;
said at least first solid state region and said at least second solid state region are disposed with respect to each other so that the circulation of a negative electrical charge experiences an increasing potential energy barrier when circulating from one of said at least first solid state region and said second solid state region to the other of said at least first solid state region and said second solid state region;
wherein M=2, and $SE_1$ and $SE_2$ are in electrical communication with each other through an ohmic contact, and $SE_1$ and $SE_2$ are configured for electrical connection with and exterior electrical circuit; and
said superconducting element hot ohmic contacts are separated from said cold ohmic contacts by a separator that is in contact with said superconducting element hot ohmic contacts and with said cold ohmic contacts.

* * * * *

UNITED STATES PATENT AND TRADEMARK OFFICE
CERTIFICATE OF CORRECTION

PATENT NO. : 6,779,347 B2
DATED : August 24, 2004
INVENTOR(S) : Yan R. Kucherov and Peter L. Hagelstein It is certified that error appears in the above-identified patent and that said Letters Patent is hereby corrected as shown below:

Column 2,
Line 58, before "The orientation" change "barrier" to -- barriers --

Column 5,
Line 19, before "forcuses" change "if" to -- it --
Line 37, before "optimized" change "filly" to -- fully --

Column 8,
Line 2, change "(refers" to -- σ referes --
Line 3, change "$\epsilon_F^e$" to -- $\varepsilon_F^e$ --

Column 9,
Line 21, before "FIG. 3.1" change ".in" to -- in --
Line 36, after "$L_n$ refers" insert -- to --

Column 11,
Line 38, change "$\epsilon_F^e [n^*]$" to -- $\varepsilon_F^e [n^*]$ --
Line 38, change "$\epsilon_F^e [n]$" to -- $\varepsilon_F^e [n]$ --

Coumn 13,
Line 64, before "by changing" change "a" to -- as --

Column 14,
Line 55, after "Utilization of" change "this" to -- these --

Column 15,
Line 8, change "$\epsilon_0$" to -- $\varepsilon_0$ --
Line 9, change "$\epsilon_r$" to -- $\varepsilon_r$ --
Line 10, change "$\epsilon_r = 5$" to -- $\varepsilon_r = 5$ --
Line 16, change "$\epsilon_r = 1$" to -- $\varepsilon_r = 1$ --
Lien 59, after "power" remove "m"
Line 67, change "$V = \Pi_{n*-} \Pi_n = \phi_b$" to -- $V = \Pi_{n*} - \Pi_n = \phi_b$ --

Column 21,
Line 38, before "each includes" change "each" to -- which --
Line 46, after "elements" change "E;" to -- $E_i$ --

UNITED STATES PATENT AND TRADEMARK OFFICE
CERTIFICATE OF CORRECTION

PATENT NO. : 6,779,347 B2
DATED : August 24, 2004
INVENTOR(S) : Yan R. Kucherov and Peter L. Hagelstein It is certified that error appears in the above-identified patent and that said Letters Patent is hereby corrected as shown below:

Column 24,
Line 31, after "segment" change "$B_{i+1}$" to -- $B_{i'}$ --
Line 36, after "connecting" change "$B_{i' \text{ with } Bi'-1}$." to -- $B_{i'}$ with $B_{i'-1}$. --

Column 25,
Line 31, before "BC" change "contacts" to -- contact --
Line 49, after "superconducting elements" change "SE," to -- $SE_1$ --
Line 61, after "end that has" change "not" to -- no --

Column 27,
Line 17, before "n*n" change "in" to -- an --

Column 33,
Line 18, after "superconducting elements" change "$SE_{N-}1$" to -- $SE_{N-1}$ --

Column 36,
Line 7, after "directly connecting" change "$SB_j$" to -- $SB_{j'}$ --
Line 58, after "barrier segment" change "$B_i$" to -- $B_{i'}$ --

Signed and Sealed this

Twenty-eighth Day of December, 2004

JON W. DUDAS
*Director of the United States Patent and Trademark Office*